(12) United States Patent
Jeong et al.

(10) Patent No.: US 11,211,566 B2
(45) Date of Patent: Dec. 28, 2021

(54) ORGANIC LIGHT EMITTING DEVICE AND DISPLAY DEVICE INCLUDING THE SAME

(71) Applicant: SAMSUNG DISPLAY CO., LTD., Yongin-si (KR)

(72) Inventors: Hyein Jeong, Yongin-si (KR); Jungsub Lee, Yongin-si (KR); Jinsoo Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/940,316

(22) Filed: Jul. 27, 2020

(65) Prior Publication Data

US 2020/0358001 A1    Nov. 12, 2020

Related U.S. Application Data

(63) Continuation of application No. 15/806,523, filed on Nov. 8, 2017, now Pat. No. 10,763,439, which is a
(Continued)

(30) Foreign Application Priority Data

Nov. 5, 2014   (KR) ........................ 10-2014-0152961

(51) Int. Cl.
*H01L 51/00*   (2006.01)
*H01L 51/50*   (2006.01)

(52) U.S. Cl.
CPC ........ *H01L 51/0061* (2013.01); *H01L 51/006* (2013.01); *H01L 51/0059* (2013.01);
(Continued)

(58) Field of Classification Search
None
See application file for complete search history.

(56) References Cited

U.S. PATENT DOCUMENTS 7,586,006 B2    9/2009    Funahashi
7,887,931 B2    2/2011    Cosimbescu et al.
(Continued)

FOREIGN PATENT DOCUMENTS

EP    1 704 605 B1    3/2012
JP    2007-045816 A    2/2007
(Continued)

OTHER PUBLICATIONS

Computer-generated English-language translation of WO-2013191177-A1.*
(Continued)

*Primary Examiner* — Vu A Nguyen
(74) *Attorney, Agent, or Firm* — Lewis Roca Rothgerber Christie LLP

(57) ABSTRACT

An organic light emitting device and a display device, the organic light emitting device including a first electrode; a hole transport region on the first electrode; an emission layer
(Continued)

on the hole transport region; an electron transport region on the emission layer; and a second electrode on the electron transport region, wherein the hole transport region includes a compound represented by the following Formula 1:

[Formula 1]

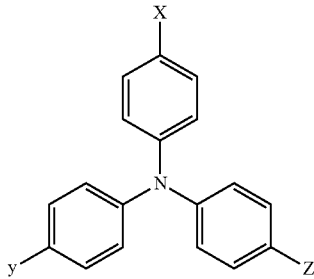

19 Claims, 5 Drawing Sheets

Related U.S. Application Data continuation of application No. 14/695,678, filed on Apr. 24, 2015, now Pat. No. 9,818,954.

(52) U.S. Cl.
CPC ...... *H01L 51/0072* (2013.01); *H01L 51/0073* (2013.01); *H01L 51/0052* (2013.01); *H01L 51/0054* (2013.01); *H01L 51/0058* (2013.01); *H01L 51/0067* (2013.01); *H01L 51/5012* (2013.01); *H01L 51/5056* (2013.01); *H01L 51/5072* (2013.01)

(56) References Cited

U.S. PATENT DOCUMENTS

| | | | |
|---|---|---|---|
| 7,892,878 B2 | 2/2011 | Lee et al. | |
| 8,268,997 B2 * | 9/2012 | Yamakawa | C07D 251/24 544/180 |
| 8,569,485 B2 | 10/2013 | Yamakawa et al. | |
| 8,878,751 B2 | 11/2014 | Chung et al. | |
| 9,691,991 B2 | 6/2017 | Hong et al. | |
| 10,556,864 B2 | 2/2020 | Nomura et al. | |
| 2008/0024059 A1 | 1/2008 | Hsu | |
| 2009/0322215 A1 | 12/2009 | Sung et al. | |
| 2013/0119355 A1 | 5/2013 | Han et al. | |
| 2013/0285537 A1 | 10/2013 | Chaji | |
| 2014/0077179 A1 | 3/2014 | Shin et al. | |
| 2014/0183517 A1 | 7/2014 | Huh et al. | |
| 2014/0346406 A1 * | 11/2014 | Lee | C09K 11/06 252/500 |
| 2015/0179951 A1 | 6/2015 | Fuchiwaki | |
| 2015/0325800 A1 | 11/2015 | Ito et al. | |
| 2015/0364693 A1 | 12/2015 | Ito et al. | |
| 2015/0380662 A1 | 12/2015 | Kim et al. | |

FOREIGN PATENT DOCUMENTS

| | | | |
|---|---|---|---|
| JP | 2008-130840 A | 6/2008 | |
| JP | 2008-172229 A | 7/2008 | |
| JP | 4 772280 B2 | 7/2011 | |
| JP | 4965914 B2 | 4/2012 | |
| KR | 10-2009-0130008 A | 12/2009 | |
| KR | 10-2010-0007552 A | 1/2010 | |
| KR | 10-2010-0099250 A | 9/2010 | |
| KR | 10-2013-0098225 A | 9/2013 | |
| KR | 10-2013-0098227 A | 9/2013 | |
| KR | 10-2013-0106255 A | 9/2013 | |
| KR | 10-2013-0136366 A | 12/2013 | |
| KR | 10-2014-0093927 A | 7/2014 | |
| KR | 10-2014-1472057 B1 | 12/2014 | |
| KR | 10-2016-0004513 A | 1/2016 | |
| WO | WO 2013/175747 A1 | 11/2013 | |
| WO | WO 2013/171177 A1 | 12/2013 | |
| WO | WO-2013/191177 A1 | 12/2013 | |
| WO | WO-2013191177 A1 * | 12/2013 | C07D 401/14 |
| WO | WO 2014/141725 A1 | 2/2017 | |

OTHER PUBLICATIONS

Machine-generated English-language translation of KR 10-2013-0098227 A to Koo et al. (Year: 2013).
Third-Party Submission under 37 C.F.R. § 1.290 filed Nov. 2, 2016, in parent U.S. Appl. No. 14/695,678.
United States Patent and Trademark Office Action for U.S. Appl. No. 90/014,242, filed Jan. 4, 2019, Final Ex Parte Reexamination, dated Jul. 3, 2019, 44 pages.
Request for Ex parte Re-examination dated Jan. 18, 2019 from the U.S Patent Office in respect of the U.S. Appl. No. 14/695,678 (U.S. Pat. No. 9,818,954 82).
Office Action dated Apr. 12, 2019 from the U.S. Patent Office in respect to the co-pending related U.S. Appl. No. 90/014,242.
Sci Finder Search (Aug. 12, 2019).

\* cited by examiner

ORGANIC LIGHT EMITTING DEVICE AND DISPLAY DEVICE INCLUDING THE SAME

CROSS-REFERENCE TO RELATED APPLICATION(S)

This application is a continuation of, and claims priority to and the benefit of U.S. patent application Ser. No. 15/806,523, filed Nov. 8, 2017, which is a continuation of U.S. patent application Ser. No. 14/695,678, filed Apr. 24, 2015, now U.S. Pat. No. 9,818,954, issued Nov. 14, 2017, both of which claim priority to and the benefit of Korean Patent Application No. 10-2014-0152961 filed on Nov. 5, 2014 in the Korean Intellectual Property Office, the entire contents of all of which are incorporated herein by reference.

BACKGROUND

1. Field

Embodiments relate to an organic light emitting device and a display device including the same.

2. Description of the Related Art

Flat display devices are mainly classified as a light emitting type and a light receiving type. The light emitting type may include a flat cathode ray tube, a plasma display panel, an organic light emitting display (OLED), etc. The OLED is a self-luminescent display and has advantages of wide viewing angles, good contrast, and rapid response time.

Thus, the OLED may be applicable in a display for a mobile device such as a digital camera, a video camera, a camcorder, a personal digital assistant, a smart phone, an ultra-thin laptop, a tablet personal computer, a flexible display, etc., or a large-sized electronic products such as an ultra-thin television or a large-sized electric products, and receives much attention.

The OLED may embody color based on the principle that holes and electrons injected from a first electrode and a second electrode are recombined in an emission layer, and excitons obtained by the combination of the injected holes and electrons emit light during the transition thereof from an excited state to a ground state.

SUMMARY

Embodiments are directed to an organic light emitting device and a display device including the same Embodiments provide organic light emitting devices including a first electrode, a hole transport region provided on the first electrode, an emission layer provided on the hole transport region, an electron transport region provided on the emission layer, and a second electrode provided on the electron transport region. The hole transport region includes a compound represented by the following Formula 1.

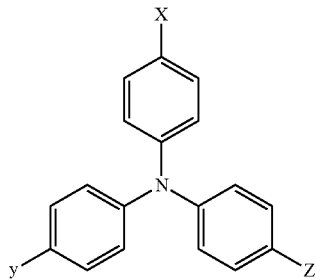

[Formula 1]

In the above Formula 1, X, Y and Z are independently selected from the group consisting of hydrogen, deuterium, a substituted or unsubstituted aromatic ring having 5 to 30 carbon atoms, a substituted or unsubstituted condensed aromatic ring having 5 to 30 carbon atoms, a substituted or unsubstituted heteroaromatic ring having 5 to 30 carbon atoms, a substituted or unsubstituted condensed heteroaromatic ring having 5 to 30 carbon atoms, a substituted or unsubstituted heteroaromatic ring having 5 to 30 carbon atoms and including N, S or O, and a substituted or unsubstituted condensed heteroaromatic ring having 5 to 30 carbon atoms and including N, S or O.

In some embodiments, X, Y and Z may be independently selected from the group consisting of hydrogen, deuterium, a substituted or unsubstituted aryl group having 5 to 30 carbon atoms, a substituted or unsubstituted heteroaryl group having 5 to 30 carbon atoms, a substituted or unsubstituted aryloxy group having 5 to 30 carbon atoms, a substituted or unsubstituted arylamino group having 5 to 30 carbon atoms, a substituted or unsubstituted diarylamino group having 5 to 30 carbon atoms, and a substituted or unsubstituted arylakyl group having 5 to 30 carbon atoms.

In other embodiments, X, Y and Z may be independently selected from the group consisting of a phenyl group, a naphthyl group, a biphenyl group, a terphenyl group, an anthracene group, a fluorenyl group and a carbazolyl group.

In still other embodiments, the hole transport region may include at least one compound selected from compounds represented in the following Formula 2.

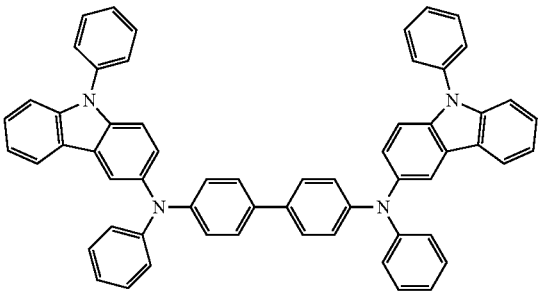

[Formula 2]

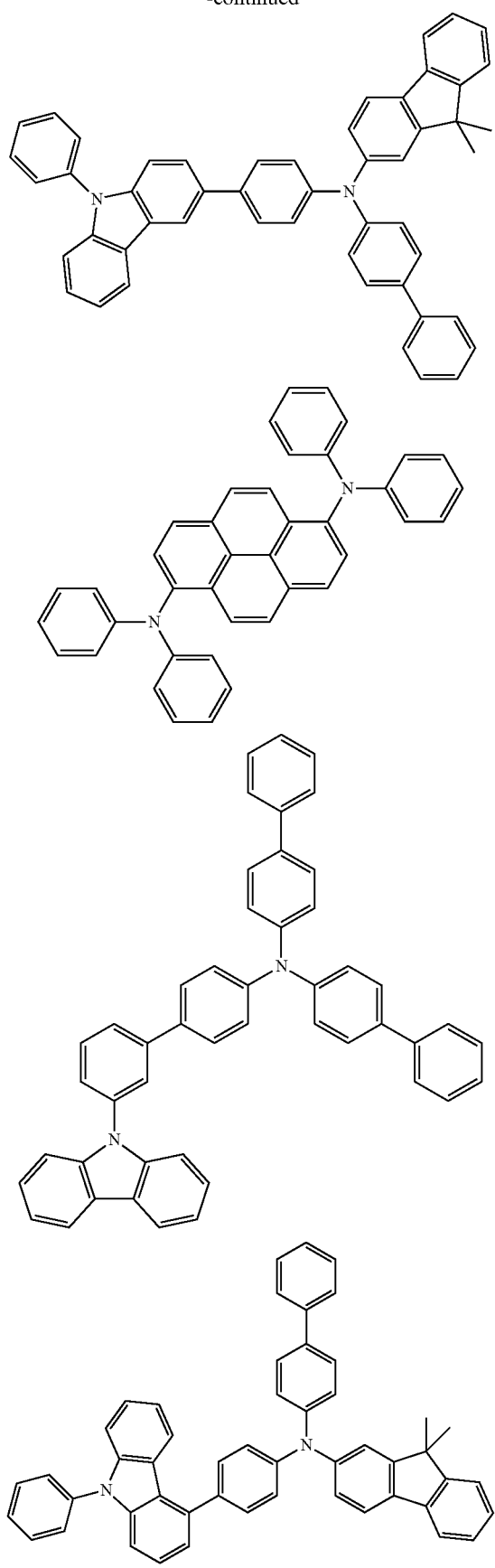
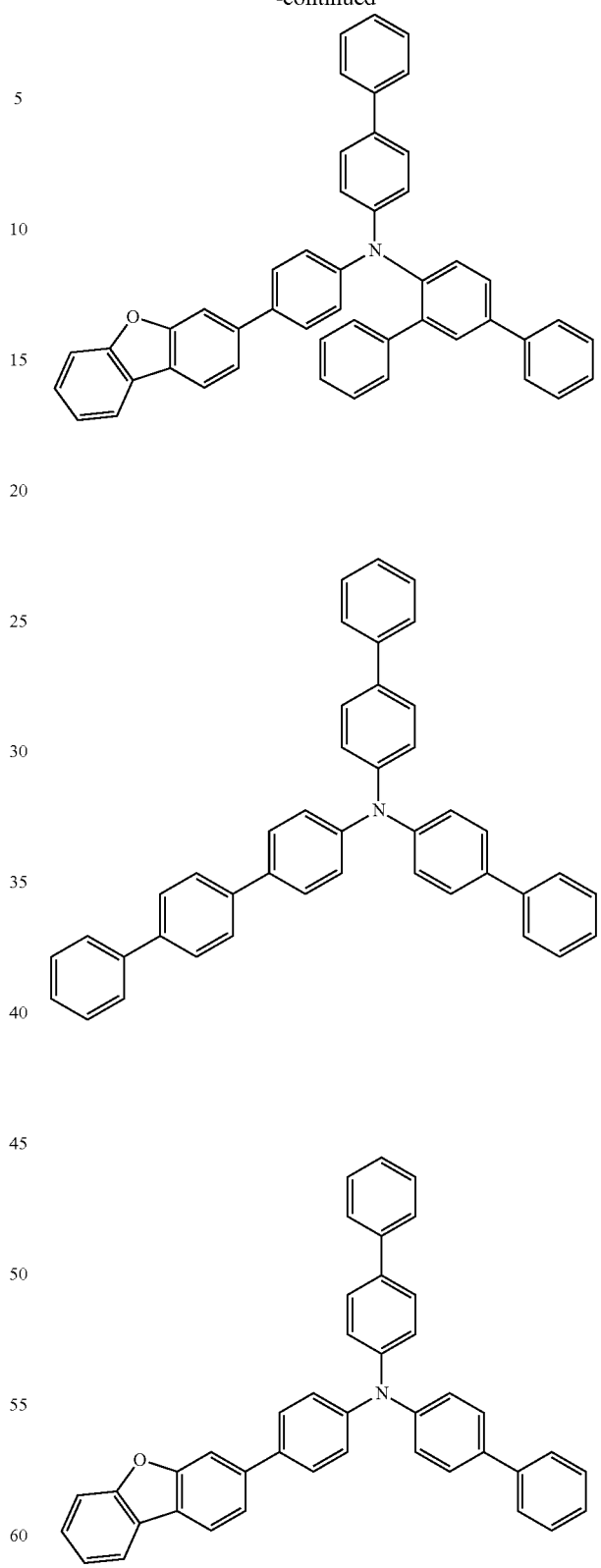
In even other embodiments, the emission layer may include a compound represented by the following Formula 3.

[Formula 3]

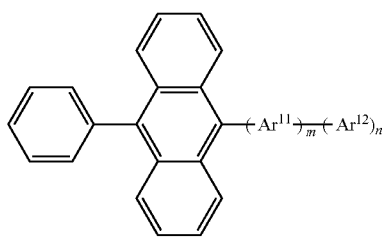

In the above Formula 3, $Ar^{11}$ and $Ar^{12}$ are independently selected from the group consisting of hydrogen, deuterium, a substituted or unsubstituted aromatic ring having 5 to 30 carbon atoms, a substituted or unsubstituted condensed aromatic ring having 5 to 30 carbon atoms, a substituted or unsubstituted heteroaromatic ring having 5 to 30 carbon atoms, a substituted or unsubstituted condensed heteroaromatic ring having 5 to 30 carbon atoms, a substituted or unsubstituted heteroaromatic ring having 5 to 30 carbon atoms and including N, S or O, and a substituted or unsubstituted condensed heteroaromatic ring having 5 to 30 carbon atoms and including N, S or O, and m and n are independently an integer of 0 to 3.

In yet other embodiments, $Ar^{11}$ may be a substituted or unsubstituted arylene group having 7 to 30 carbon atoms or a substituted or unsubstituted heteroarylene group having 7 to 30 carbon atoms, where in the case that m is 0, $Ar^{11}$ is a single bond. $Ar^{12}$ may be a substituted or unsubstituted aryl group having 5 to 30 carbon atoms or a substituted or unsubstituted heteroaryl group having 5 to 30 carbon atoms, where in the case that m or n is an integer greater than or equal to 2, $Ar^{11}$ may be the same or different, $Ar^{12}$ may be the same or different, and $Ar^{11}$ and $Ar^{12}$ may be the same or different from each other.

In further embodiments, $Ar^{11}$ may be a substituted or unsubstituted phenyl group or a substituted or unsubstituted naphthyl group.

In still further embodiments, the emission layer may include at least one compound selected from compounds represented in the following Formula 4.

[Formula 4]

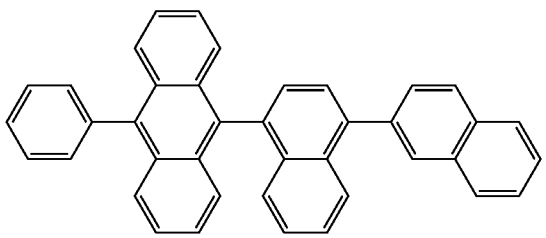

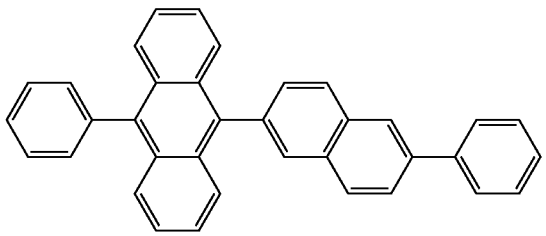

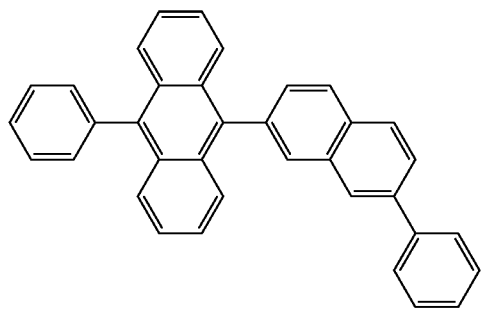

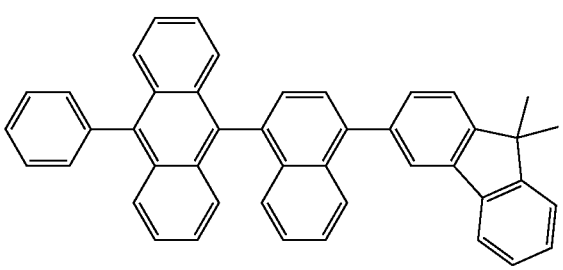

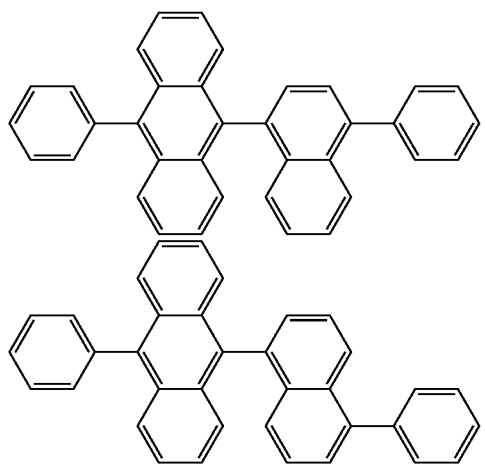

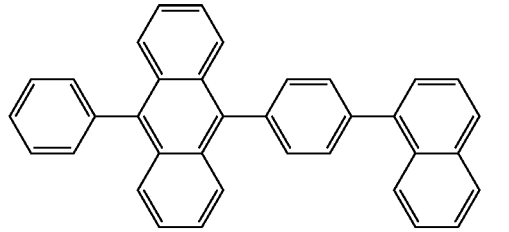

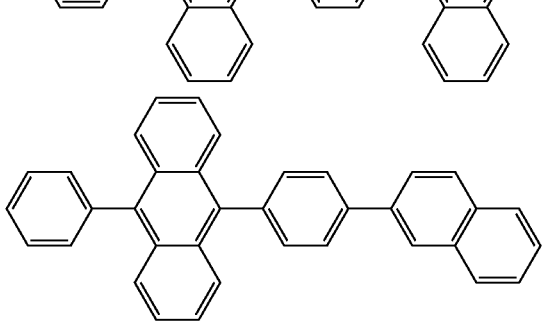

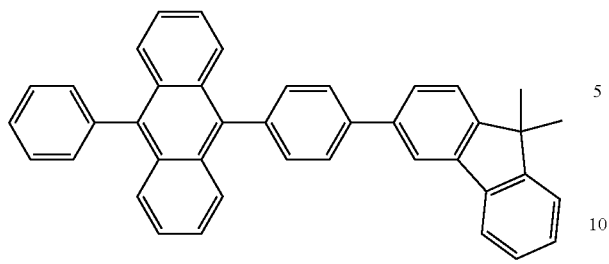

In even further embodiments, the electron transport region may include at least one compound selected from compounds represented in the following Formula 5.

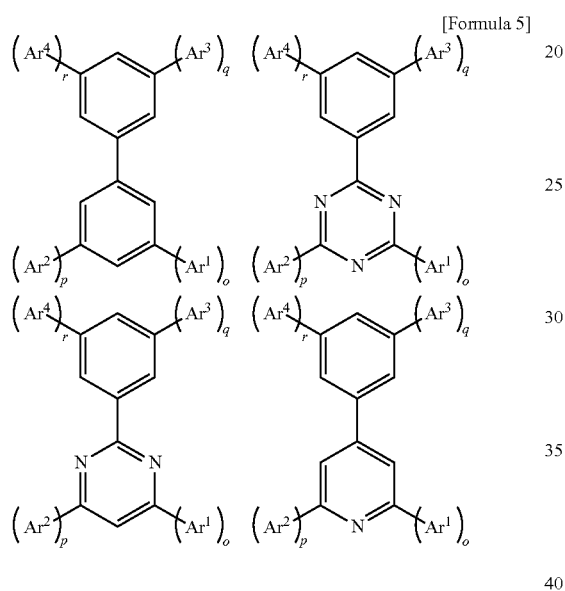

[Formula 5]

In the above Formula 5, Ar$^1$, Ar$^2$, Ar$^3$ and Ar$^4$ are independently selected from the group consisting of hydrogen, deuterium, a substituted or unsubstituted aromatic ring having 5 to 30 carbon atoms, a substituted or unsubstituted condensed aromatic ring having 5 to 30 carbon atoms, a substituted or unsubstituted heteroaromatic ring having 5 to 30 carbon atoms, a substituted or unsubstituted condensed heteroaromatic ring having 5 to 30 carbon atoms, a substituted or unsubstituted heteroaromatic ring having 5 to 30 carbon atoms and including N, S or O, and a substituted or unsubstituted condensed heteroaromatic ring having 5 to 30 carbon atoms and including N, S or O, and o, p, q and r are independently an integer of 1 to 3.

In yet further embodiments, Ar$^1$, Ar$^2$, Ar$^3$ and Ar$^4$ may be independently a substituted or unsubstituted aryl group having 5 to 30 carbon atoms or a substituted or unsubstituted heteroaryl group having 5 to 30 carbon atoms, where in the case that o, p, q and r are independently greater than or equal to 2, Ar$^1$ may be the same or different, Ar$^2$ may be the same or different, Ar$^3$ may be the same or different, Ar$^4$ may be the same or different, and Ar$^1$, Ar$^2$, Ar$^3$ and Ar$^4$ may be the same from each other, or at least one thereof may be different.

In much further embodiments, the electron transport region may include at least one compound selected from compounds represented in the following Formula 6.

[Formula 6]

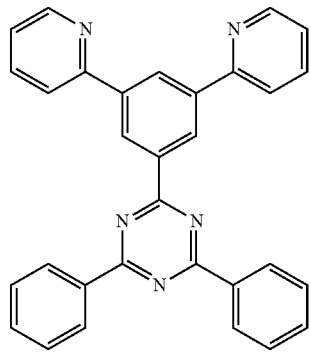

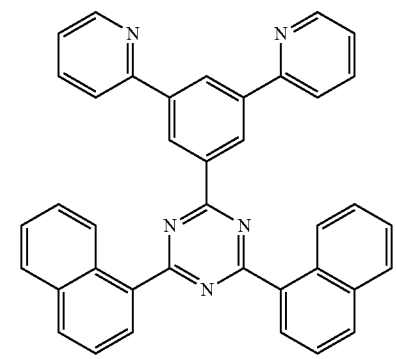

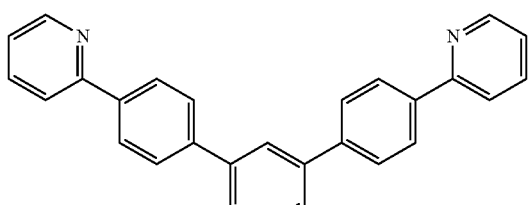

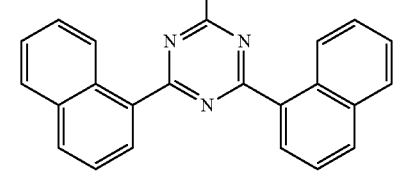

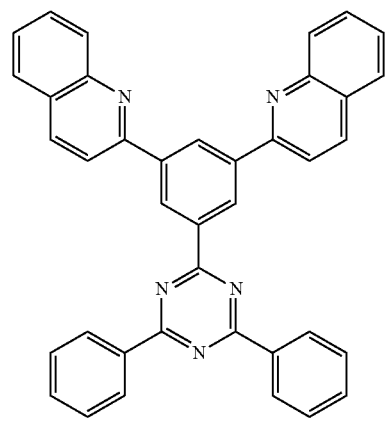

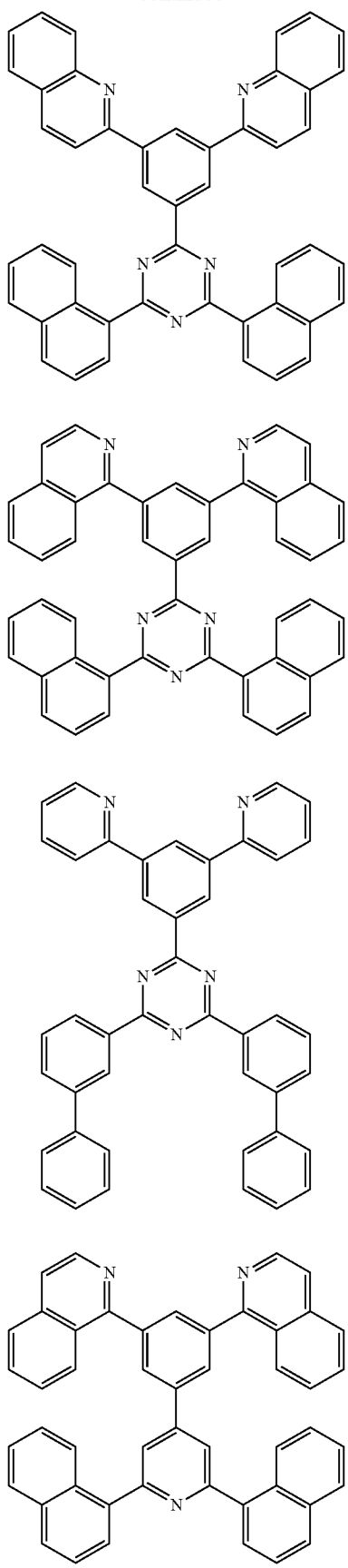

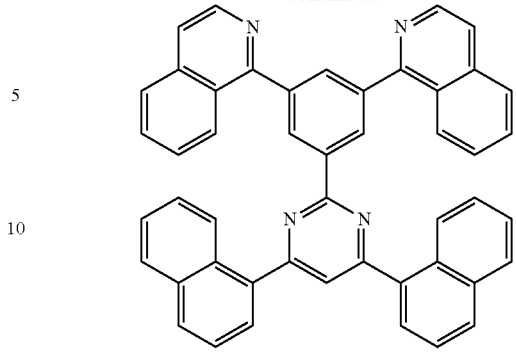

In other embodiments, display devices include a plurality of pixels. One of the pixels includes a first electrode, a hole transport region provided on the first electrode, an emission layer provided on the hole transport region, an electron transport region provided on the emission layer, and a second electrode provided on the electron transport region. The hole transport region includes a compound represented by the following Formula 1.

[Formula 1]

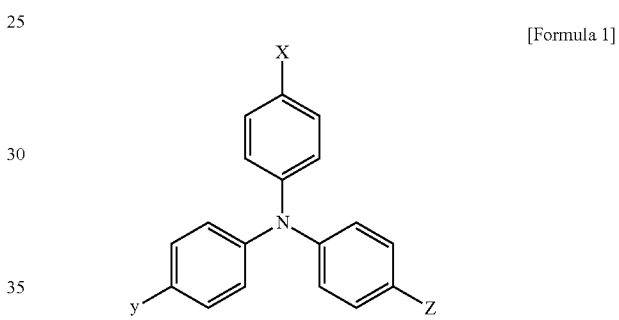

In the above Formula 1, X, Y and Z are independently selected from the group consisting of hydrogen, deuterium, a substituted or unsubstituted aromatic ring having 5 to 30 carbon atoms, a substituted or unsubstituted condensed aromatic ring having 5 to 30 carbon atoms, a substituted or unsubstituted heteroaromatic ring having 5 to 30 carbon atoms, a substituted or unsubstituted condensed heteroaromatic ring having 5 to 30 carbon atoms, a substituted or unsubstituted heteroaromatic ring having 5 to 30 carbon atoms and including N, S or O, and a substituted or unsubstituted condensed heteroaromatic ring having 5 to 30 carbon atoms and including N, S or O.

In some embodiments, the hole transport region may include at least one compound selected from compounds represented in the following Formula 2.

[Formula 2]

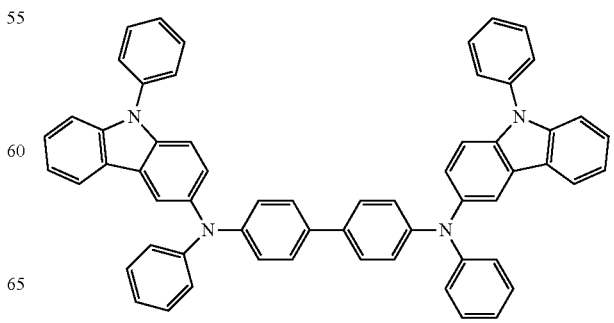

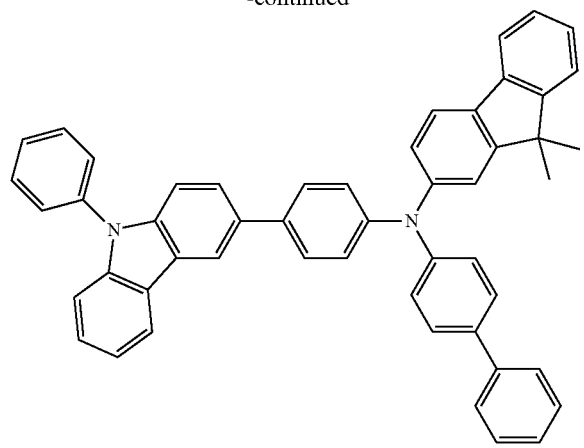
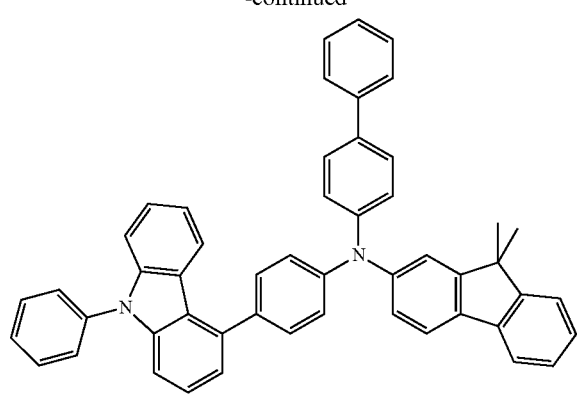
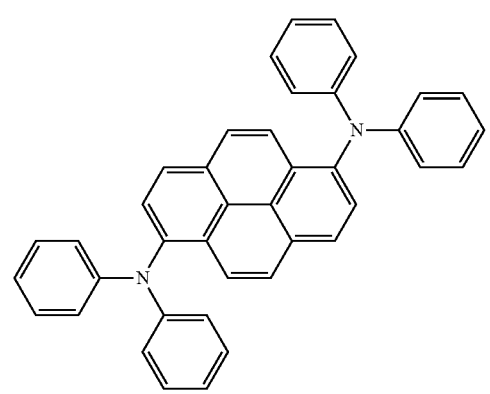
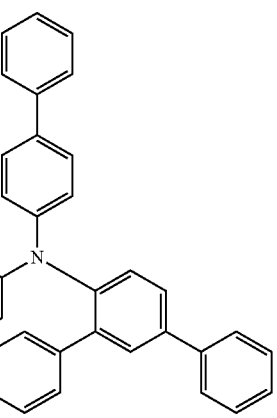
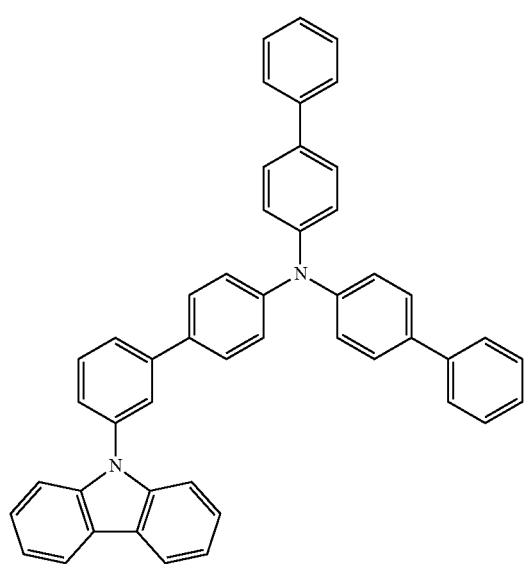
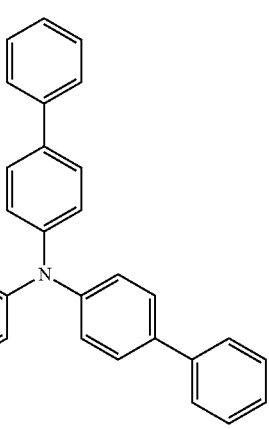

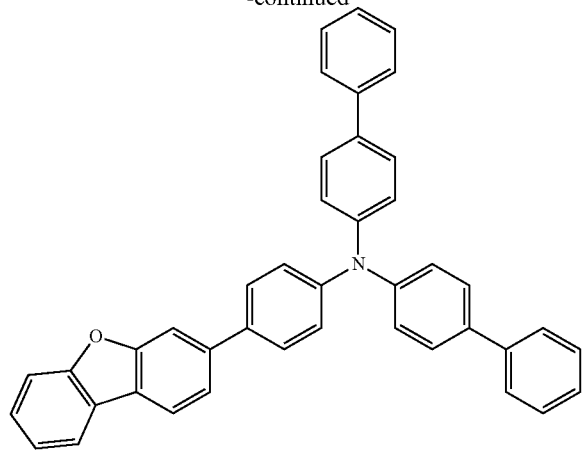

In other embodiments, the hole transport region may include a hole injection layer provided on the first electrode and a hole transport layer provided on the hole injection layer.

In still other embodiments, the emission layer may include a compound represented by the following Formula 3.

[Formula 3]

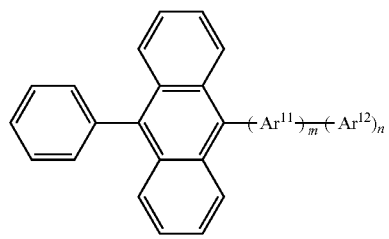

In the above Formula 3, $Ar^{11}$ and $Ar^{12}$ are independently selected from the group consisting of hydrogen, deuterium, a substituted or unsubstituted aromatic ring having 5 to 30 carbon atoms, a substituted or unsubstituted condensed aromatic ring having 5 to 30 carbon atoms, a substituted or unsubstituted heteroaromatic ring having 5 to 30 carbon atoms, a substituted or unsubstituted condensed heteroaromatic ring having 5 to 30 carbon atoms, a substituted or unsubstituted heteroaromatic ring having 5 to 30 carbon atoms and including N, S or O, and a substituted or unsubstituted condensed heteroaromatic ring having 5 to 30 carbon atoms and including N, S or O, and m and n are independently an integer of 0 to 3.

In even other embodiments, the emission layer may include at least one compound selected from compounds represented in the following Formula 4.

[Formula 4]

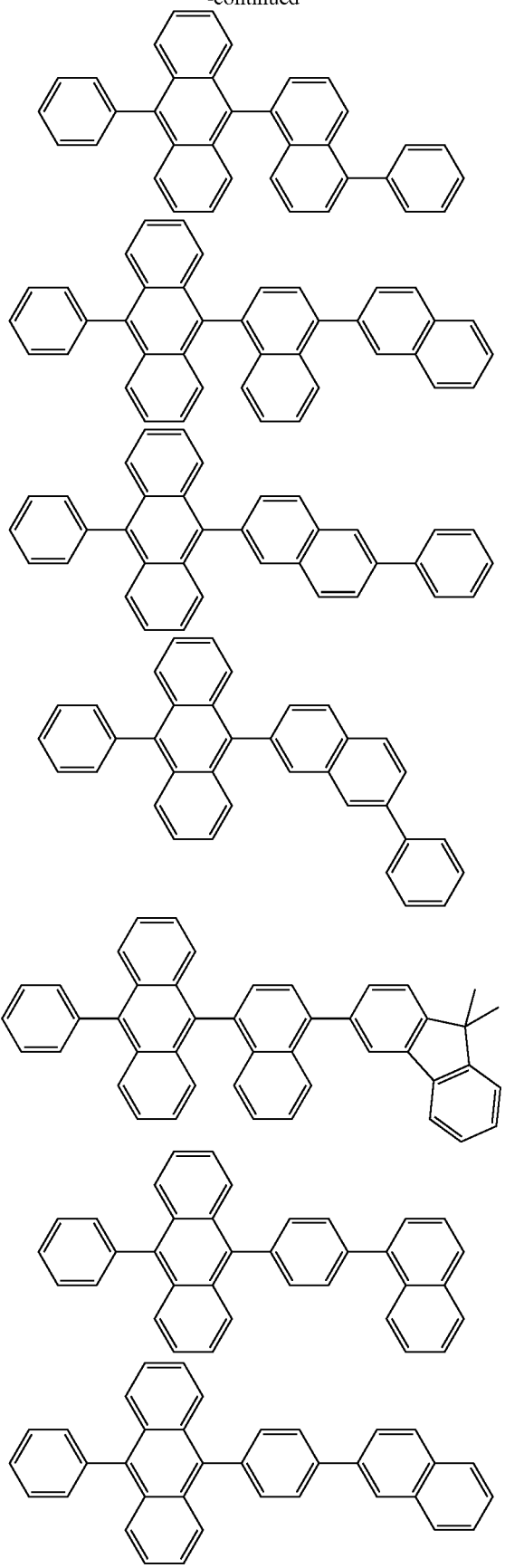

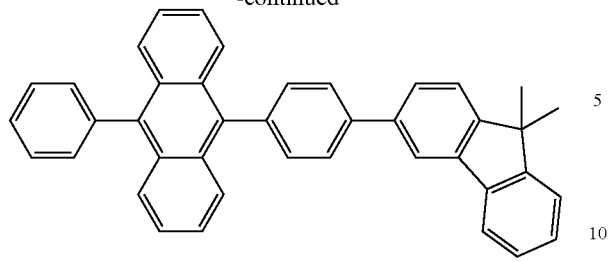

In yet other embodiments, the electron transport region may include at least one compound selected from compounds represented in the following Formula 5.

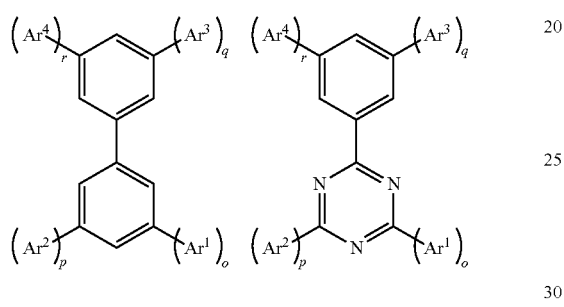

[Formula 5]

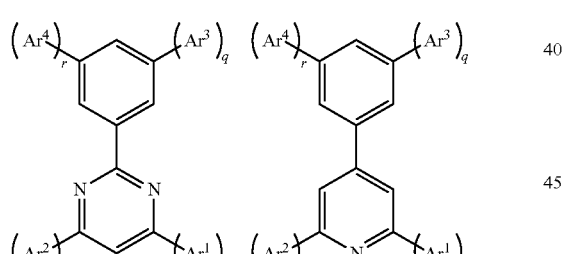

In the above Formula 5, Ar$^1$, Ar$^2$, Ar$^3$ and Ar$^4$ are independently selected from the group consisting of hydrogen, deuterium, a substituted or unsubstituted aromatic ring having 5 to 30 carbon atoms, a substituted or unsubstituted condensed aromatic ring having 5 to 30 carbon atoms, a substituted or unsubstituted heteroaromatic ring having 5 to 30 carbon atoms, a substituted or unsubstituted condensed heteroaromatic ring having 5 to 30 carbon atoms, a substituted or unsubstituted heteroaromatic ring having 5 to 30 carbon atoms and including N, S or O, and a substituted or unsubstituted condensed heteroaromatic ring having 5 to 30 carbon atoms and including N, S or O, and o, p, q and r are independently an integer of 1 to 3.

In further embodiments, the electron transport region may include at least one compound selected from compounds represented in the following Formula 6.

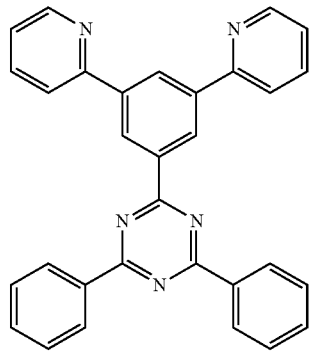

[Formula 6]

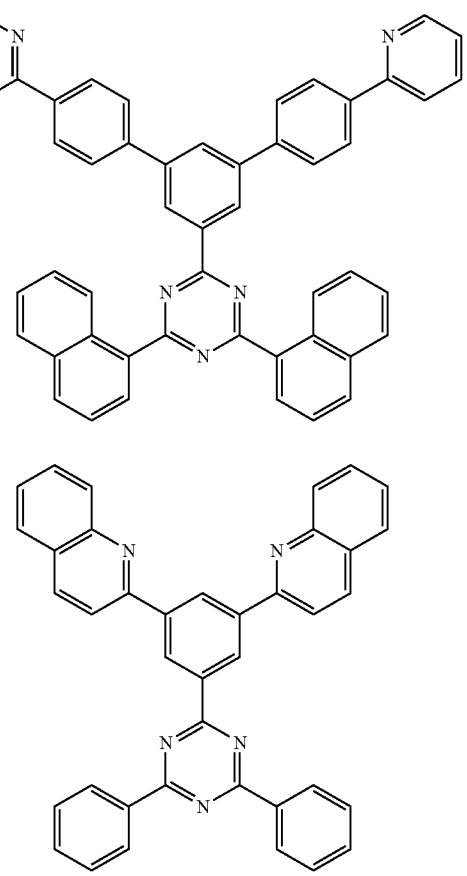

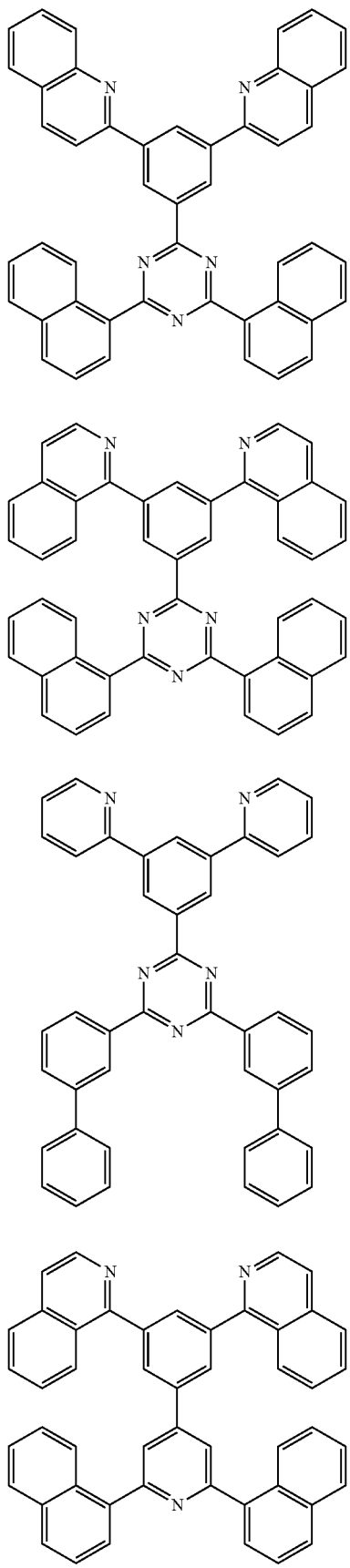
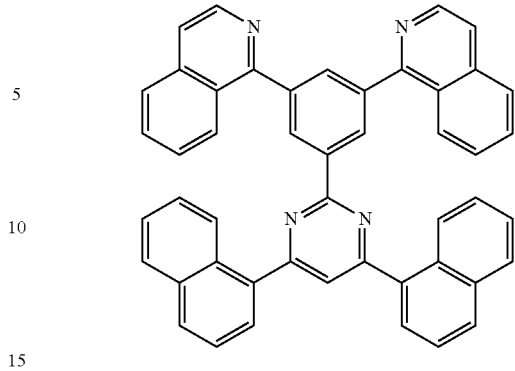

In still further embodiments, the electron transport region may include an electron transport layer provided on the emission layer and an electron injection layer provided on the electron transport layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
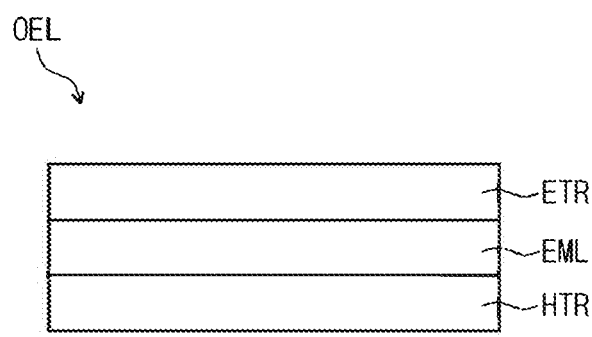
FIG. 1 illustrates a schematic cross-sectional view of an organic light emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "comprises," and/or "comprising," when used in this specification, specify the presence of stated features, steps, operations, and/or devices, but do not preclude the presence or addition of one or more other features, steps, operations, and/or devices thereof. It will also be understood that when a layer, a film, a region, a plate, etc. is referred to as being cony another part, it can be directly on the other part, or intervening layers may also be present. When a layer, a film, a region, a plate, etc. is referred to as being 'under' another part, it can be directly under the other part, or intervening layers may also be present.

Hereinafter, exemplary embodiments of the organic light emitting device will be described in detail.

FIG. 1 illustrates a schematic cross-sectional view of an organic light emitting device according to an embodiment.

Referring to FIG. 1, an organic light emitting device OEL according to an embodiment may include a hole transport region HTR, an emission layer EML, and an electron transport region ETR.

Figure 2:
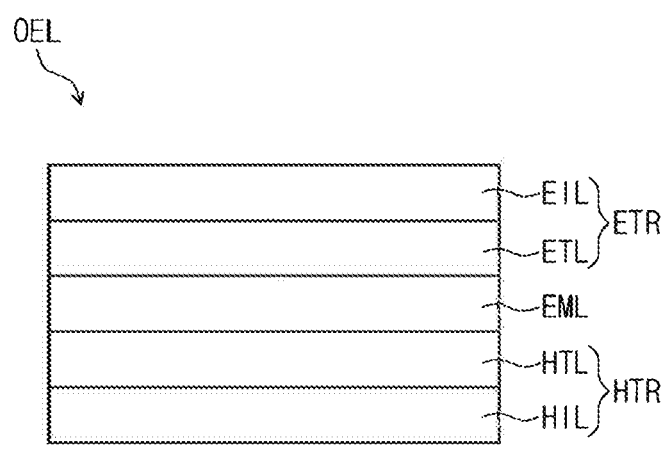
FIG. 2 illustrates a schematic cross-sectional view of an organic light emitting device according to an embodiment.

FIG. 2 illustrates a schematic cross-sectional view of an organic light emitting device according to an embodiment.

Referring to FIG. 2, an organic light emitting device OEL according to an embodiment may include a hole transport region HTR, an emission layer EML and an electron transport region ETR.

The hole transport region HTR may include a hole injection layer HIL and a hole transport layer HTL. The hole injection layer HIL may be provided on a first electrode EL1 (see FIG. 5). The hole transport layer HTL may be provided on the hole injection layer HIL.

The electron transport region ETR may include an electron transport layer ETL and an electron injection layer EIL. The electron transport layer ETL may be provided on the emission layer EML. The electron injection layer EIL may be provided on the electron transport layer ETL.

Referring to FIGS. 1 and 2, the first electrode EL1 has conductivity. The first electrode EL1 may be a pixel electrode or an anode.

The first electrode EL1 may be formed as a transparent electrode or a reflective type electrode. When the first electrode EL1 is formed as the transparent electrode, the first electrode EL1 may be formed using a transparent metal oxide, e.g., indium tin oxide (ITO), indium zinc oxide (IZO), zinc oxide (ZnO), indium tin zinc oxide (ITZO), etc. When the first electrode EL1 is formed as the reflective type electrode, the first electrode EL1 may include a reflection layer formed by using Ag, Mg, Al, Pt, Pd, Au, Ni, Nd, Ir, Cr or a compound thereof and a transparent conductive layer formed by using ITO, IZO, ZnO, ITZO, etc.

The organic light emitting device OEL may include an organic layer. The organic layer may be provided between the first electrode EL1 and the second electrode EL2. The organic layer may include the emission layer EML. The organic layer may further include the hole transport region HTR and the electron transport region ETR.

The hole transport region HTR may be provided on the first electrode EL1. The hole transport region HTR may include, e.g., at least one of a hole injection layer, a hole transport layer, a buffer layer, and an electron blocking layer.

The hole transport region HTR may have a single layer formed by using a single material, a single layer formed by using a plurality of different materials, or a multilayered structure including a plurality of layers formed by using a plurality of different materials.

For example, the hole transport region HTR may have the structure of a single layer formed by using a plurality of different materials, or a laminated structure of, from the first electrode EL1, a hole injection layer HIL/hole transport layer HTL, hole injection layer HIL/hole transport layer HTL/buffer layer, hole injection layer HIL/buffer layer, hole transport layer HTL/buffer layer or hole injection layer HIL/hole transport layer HTL/electron blocking layer.

The hole transport region HTR may be formed by using various methods e.g., a vacuum deposition method, a spin coating method, a cast method, a Langmuir-Blodgett (LB) method, an inkjet printing method, a laser printing method, a laser induced thermal imaging (LITI) method, etc.

The thickness of the hole transport region HTR may be from about 100 Å to about 10,000 Å, e.g., from about 100 Å to about 1,000 Å. When the hole transport region HTR includes both the hole injection layer HIL and the hole transport layer HTL, the thickness of the hole injection layer HIL may be from about 100 Å to about 10,000 Å, e.g., from about 100 Å to about 1,000 Å, and the thickness of the hole transport layer HTL may be from about 50 Å to about 2,000 Å, e.g., from about 100 to about 1,500. When the thicknesses of the hole transport region HTR, the hole injection layer HIL and the hole transport layer HTL satisfy the above-described ranges, satisfactory hole transport properties may be obtained without substantial increase of a driving voltage.

The hole transport region HTR may include a compound represented by the following Formula 1. In an implementation, the display device according to an embodiment may include an organic light emitting device including a hole transport region including a compound represented by the following Formula 1. Thus, a band gap between the energy band of the hole transport region and the energy band of the emission layer may be decreased, and the injection of holes into the emission layer may become easy. Thus, the display according to an embodiment may exhibit high efficiency and long life.

[Formula 1]

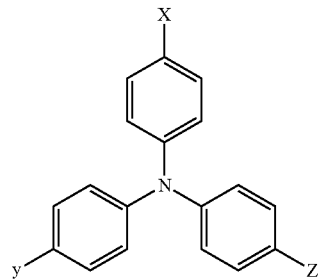

In the above Formula 1, X, Y, and Z may each independently be selected from or include, e.g., hydrogen, deuterium, a substituted or unsubstituted aromatic ring or group having 5 to 30 carbon atoms (e.g., a substituted or unsubstituted condensed aromatic group having 5 to 30 carbon atoms), and a substituted or unsubstituted heteroaromatic group having 5 to 30 carbon atoms (e.g., a substituted or unsubstituted condensed heteroaromatic group having 5 to 30 carbon atoms). In an implementation, X, Y, and Z may each independently be selected from or include, e.g., a substituted or unsubstituted heteroaromatic group having 5 to 30 carbon atoms and including N, S or O, and a substituted or unsubstituted condensed heteroaromatic group having 5 to 30 carbon atoms and including N, S or O.

In an implementation, X, Y, and Z may each independently be selected from or include, e.g., hydrogen, deuterium, a substituted or unsubstituted aryl group having 5 to 30 carbon atoms, a substituted or unsubstituted heteroaryl group having 5 to 30 carbon atoms, a substituted or unsubstituted aryloxy group having 5 to 30 carbon atoms, a substituted or unsubstituted arylamino group having 5 to 30 carbon atoms, a substituted or unsubstituted diarylamino group having 5 to 30 carbon atoms, and a substituted or unsubstituted arylakyl group having 5 to 30 carbon atoms.

In an implementation, X, Y, and Z may each independently be selected from, e.g., a phenyl group, a naphthyl group, a biphenyl group, a terphenyl group, an anthracene group, a fluorenyl group, and a carbazolyl group.

In an implementation, the hole transport region HTR may include at least one of the following compounds. For example, the compound represented by Formula 1 may be one of the following compounds.

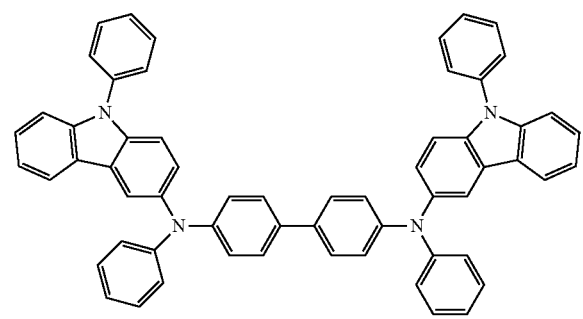

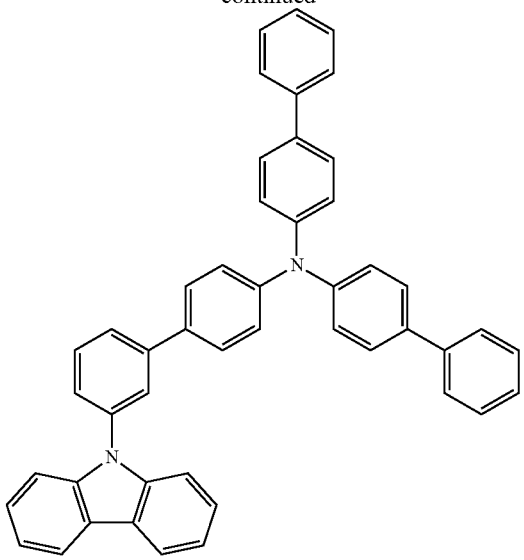

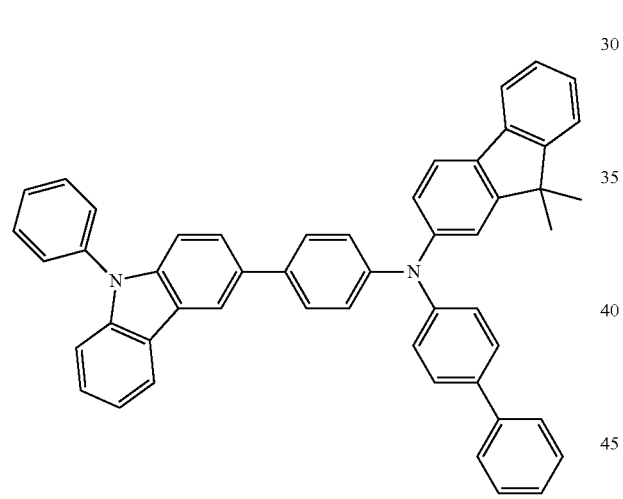

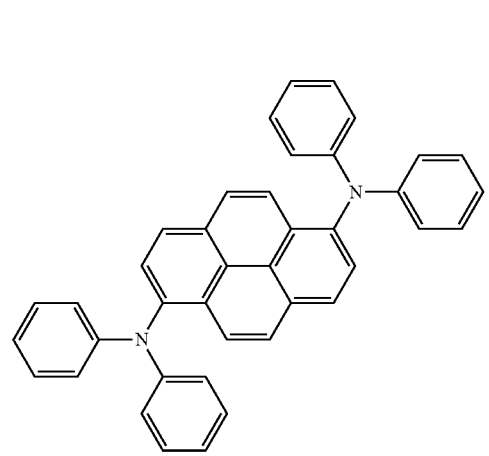

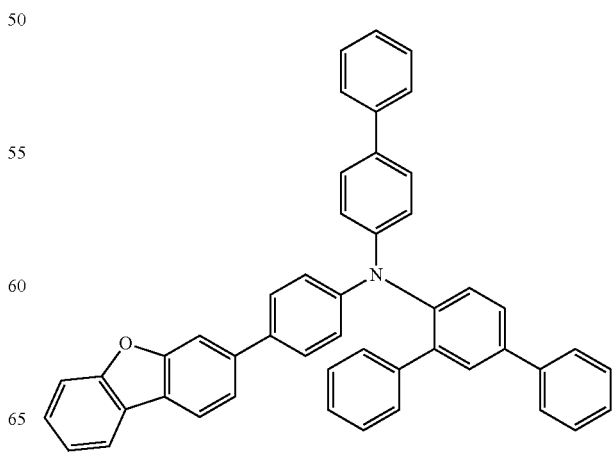

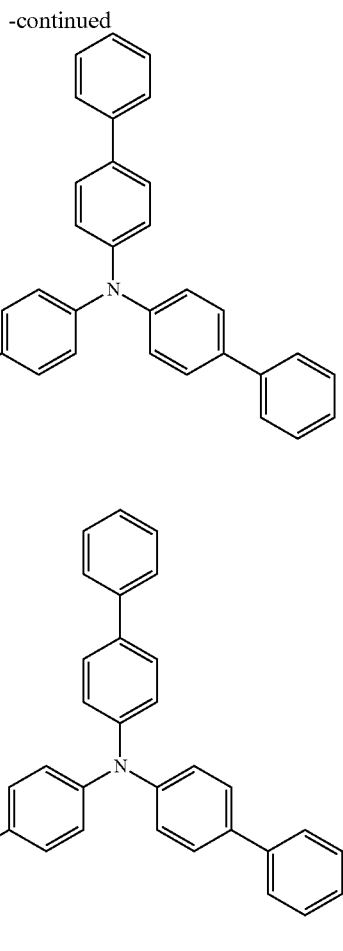

When the hole transport region HTR includes the hole injection layer HIL, the hole transport region HTR may further include, e.g., a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), (polyaniline)/poly(4-styrenesulfonate) (PANI/PSS), etc.

When the hole transport region HTR includes the hole transport layer HTL, the hole transport region HTR may further include, e.g., a carbazole derivative such as N-phenylcarbazole, polyvinyl carbazole, etc., a fluorine-based derivative, N,N'-bis(3-methylphenyl)-N,N'-diphenyl-[1,1-biphenyl]-4,4'-diamine (TPD), a triphenylamine derivative such as 4,4',4"-tris(N-carbazolyl)triphenylamine (TCTA), etc., N,N'-di(1-naphthyl)-N,N'-diphenylbenzidine (NPB), 4,4'-cyclohexylidene bis[N,N-bis(4-methylphenyl)benzenamine (TAPC).

The hole transport region HTR may further include a charge generating material to help improve conductivity other than the above-described materials. The charge generating material may be dispersed in the hole transport region HTR uniformly or non-uniformly. The charge generating material may be, e.g., a p-type dopant. The p-type dopant may be, e.g., one of a quinone derivative, a metal oxide, and a cyano group-containing compound. Examples of the p-dopant may include a quinone derivative such as tetracyanoquinodimethane (TCNQ), 2,3,5,6-tetrafluoro-tetracyanoquinodimethane (F4-TCNQ), etc., a metal oxide such as tungsten oxide, molybdenum oxide, etc.

As described above, the hole transport region HTR may further include one of a buffer layer and an electron blocking layer other than the hole injection layer HIL and the hole transport layer HTL. The buffer layer may compensate an optical resonance range according to the wavelength of light emitted from the emission layer EML and increase light emission efficiency. Materials included in the hole transport region HTR may be used as materials included in the buffer layer. The electron blocking layer is a layer that helps prevent electron injection from the electron transport region ETR.

The emission layer EML may be provided on the hole transport region HTR. The emission layer EML may have a single layer formed by using a single material, a single layer formed by using a plurality of different materials, or a multilayered structure including a plurality of layers formed by using a plurality of layers formed by using a plurality of different materials.

The emission layer EML may be formed by using various methods such as a vacuum deposition method, a spin coating method, a cast method, a LB method, an inkjet printing method, a laser printing method, a LITI method, etc.

The emission layer EML may be formed using suitable materials e.g., materials emitting red, green, and blue light, and may include a phosphorescent material or a fluorescent material. In an implementation, the emission layer EML may include a host or a dopant.

The host may include a compound represented by the following Formula 3. The display according to an embodiment may include an organic light emitting device including an emission layer including the compound represented by the following Formula 3, and may decrease a band gap between the energy band of the hole transport region and the energy band of the emission layer. And so, the hole injection into the emission layer may be easily performed. In addition, a band gap between the energy band of the emission layer and the energy band of the electron transport region may be decreased, and the electron injection into the emission layer may be easily performed. Therefore, the display according to an embodiment may exhibit high efficiency and long life.

[Formula 3]

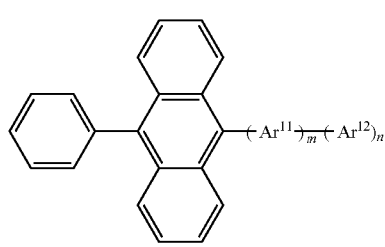

In the above Formula 3, $Ar^{11}$ and $Ar^{12}$ may each independently be selected from or include, e.g., hydrogen, deuterium, a substituted or unsubstituted aromatic group having 5 to 30 carbon atoms (e.g., a substituted or unsubstituted condensed aromatic group having 5 to 30 carbon atoms), and a substituted or unsubstituted heteroaromatic group having 5 to 30 carbon atoms (e.g., a substituted or unsubstituted condensed heteroaromatic group having 5 to 30 carbon atoms). In an implementation, $Ar^{11}$ and $Ar^{12}$ may each independently be selected from or include, e.g., a substituted or unsubstituted heteroaromatic ring having 5 to 30 carbon atoms and including N, S or O and a substituted or unsubstituted condensed heteroaromatic ring having 5 to 30 carbon atoms and including N, S or O. m and n may each independently be an integer of 0 to 3.

In an implementation, $Ar^{11}$ may include, e.g., a substituted or unsubstituted arylene group having 7 to 30 carbon atoms or a substituted or unsubstituted heteroarylene group having 7 to 30 carbon atoms. When m is 0, $Ar^{11}$ may be a single bond. In an implementation, $Ar^{12}$ may include, e.g., a substituted or unsubstituted aryl group having 5 to 30 carbon atoms or a substituted or unsubstituted heteroaryl group having 5 to 30 carbon atoms. In the case that m or n is an integer greater than or equal to 2, $Ar^{11}$ may be the same or different, $Ar^{12}$ may be the same or different, and $Ar^{11}$ and $Ar^{12}$ may be the same or different from each other.

In an implementation, $Ar^{11}$ may include, e.g., a substituted or unsubstituted phenyl group or a substituted or unsubstituted naphthyl group.

In an implementation, the host may include at least one of the following compounds. For example, the compound represented by Formula 3 may be one of the following compounds.

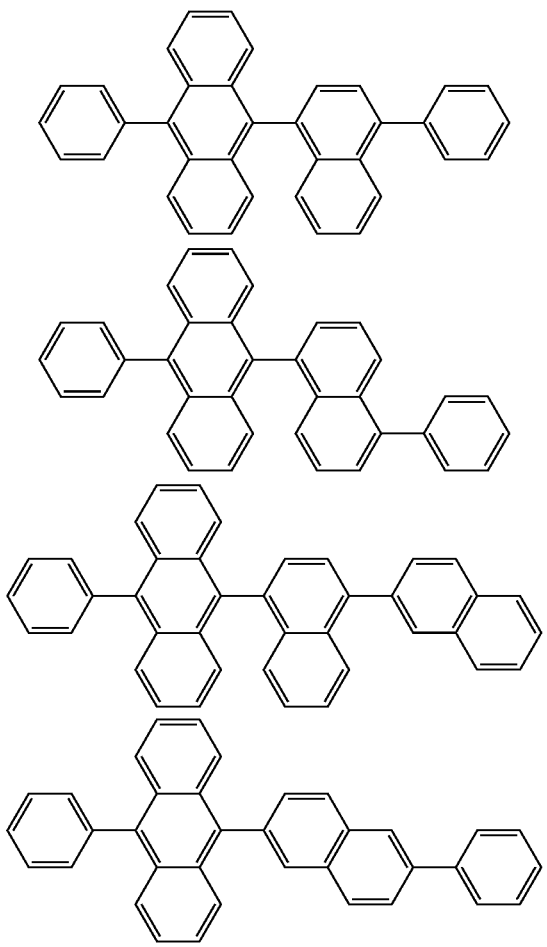

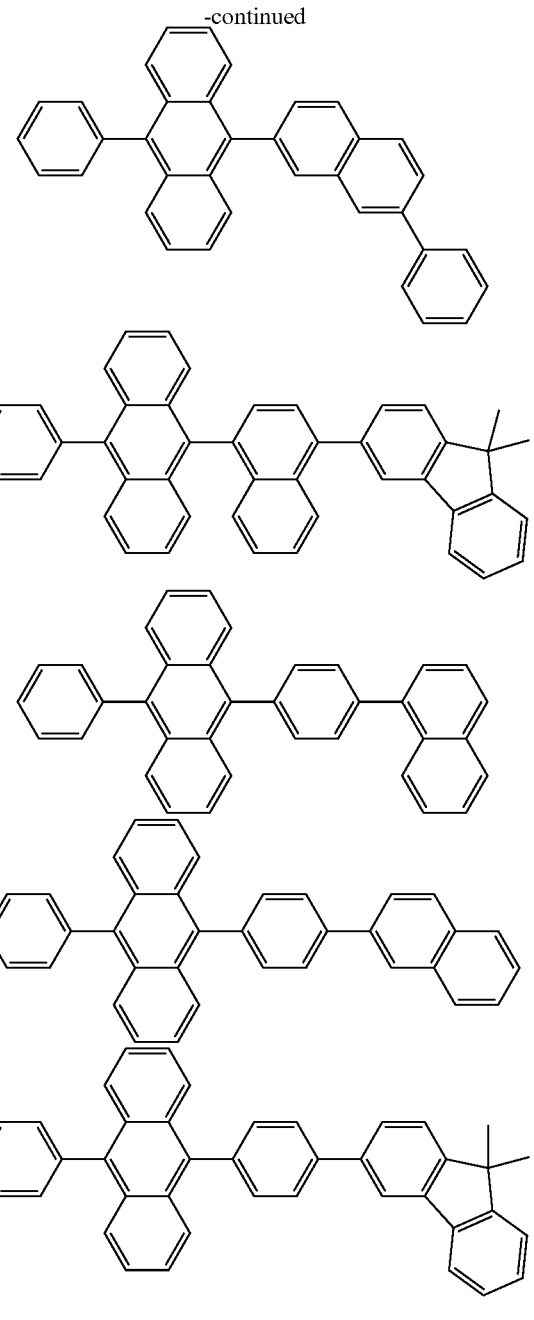

The host may further include, e.g., tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), etc.

When the emission layer EML emits red light, the emission layer EML may further include a phosphorescent material including, e.g., tris(dibenzoylmethanato)phenanthoroline europium (PBD: Eu(DBM)3(Phen)) or perylene. When the emission layer EML emits red light, the dopant further included in the emission layer EML may be selected from a metal complex or an organometallic complex such as bis(1- phenylisoquinoline)acetylacetonate iridium (PIQIr(acac)), bis(1-phenylquinoline)acetylacetonate iridium (PQIr(acac), tris(1-phenylquinoline)iridium (PQIr), and octaethylporphyrin platinum (PtOEP).

When the emission layer EML emits green light, the emission layer EML may further include a phosphorescent material including, e.g., Alq3. When the emission layer EML emits green light, the dopant further included in the emission layer EML may be selected from a metal complex or an organometallic complex such as fac-tris(2-phenylpyridine)iridium (Ir(ppy)3).

When the emission layer EML emits blue light, the emission layer EML may further include a phosphorescent material including at least one selected from, e.g., spiro-DPVBi (DPVBi), spiro-6P, distyryl-benzene (DSB), distyryl-arylene (DSA), polyfluorene (PFO)-based polymer and poly(p-phenylene vinylene) (PPV)-based polymer. When the emission layer EML emits blue light, the dopant further included in the emission layer EML may be selected from a metal complex or an organometallic complex such as (4,6-F2ppy)2Irpic.

As described above, the organic layer may further include the electron transport region ETR. The electron transport region ETR may be provided on the emission layer EML.

The electron transport region ETR may include, e.g., at least one of a hole blocking layer, an electron transport layer ETL, and an electron injection layer EIL.

For example, the electron transport region ETR may have the structure of a laminated structure of, from the emission layer EML, an electron transport layer ETL/electron injection layer EIL or hole blocking layer/electron transport layer ETL/electron injection layer EIL, or a single layer structure of the mixture of at least two of the above layers.

The electron transport region ETR may be formed by using various methods e.g., a vacuum deposition method, a spin coating method, a cast method, a LB method, an inkjet printing method, a laser printing method, a LITI method, etc.

The electron transport region ETR may include, e.g., at least one compound of the following Formula 5. The display device according to an embodiment may include, e.g., an organic light emitting device including a compound of the following Formula 5. Thus, a band gap between the energy band of the emission layer and the energy band of the electron transport layer may be decreased, and the injection of electrons into the emission layer may become easy. Thus, the display according to an embodiment may exhibit high efficiency and long life.

[Formula 5]

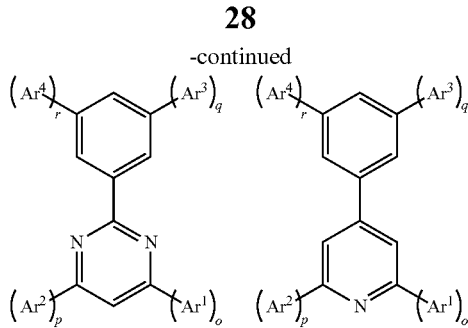

In the compounds of Formula 5, $Ar^1$, $Ar^2$, $Ar^3$, and $Ar^4$ may each independently be selected from or include, e.g., hydrogen, deuterium, a substituted or unsubstituted aromatic group having 5 to 30 carbon atoms (e.g., a substituted or unsubstituted condensed aromatic group having 5 to 30 carbon atoms), and a substituted or unsubstituted heteroaromatic group having 5 to 30 carbon atoms (e.g., a substituted or unsubstituted condensed heteroaromatic group having 5 to 30 carbon atoms). In an implementation, $Ar^1$, $Ar^2$, $Ar^3$, and $Ar^4$ may each independently be selected from or include, e.g., a substituted or unsubstituted heteroaromatic ring having 5 to 30 carbon atoms and including N, S or O and a substituted or unsubstituted condensed heteroaromatic ring having 5 to 30 carbon atoms and including N, S or O. o, p, q and r may each independently be, e.g., an integer of 1 to 3.

In an implementation, $Ar^1$, $Ar^2$, $Ar^3$, and $Ar^4$ may each independently be selected from or include, e.g., a substituted or unsubstituted aryl group having 5 to 30 carbon atoms or a substituted or unsubstituted heteroaryl group having 5 to 30 carbon atoms. In the case that o, p, q, and/or r are each independently greater than or equal to 2, $Ar^1$ may be the same or different, $Ar^2$ may be the same or different, $Ar^3$ may be the same or different, $Ar^4$ may be the same or different, and Ar1, Ar2, $Ar^3$ and $Ar^4$ may be the same, or at least one thereof may be different.

The electron transport region ETR may include, e.g., at least one of the following compounds. For example, the compound of Formula 5 may be one of the following compounds.

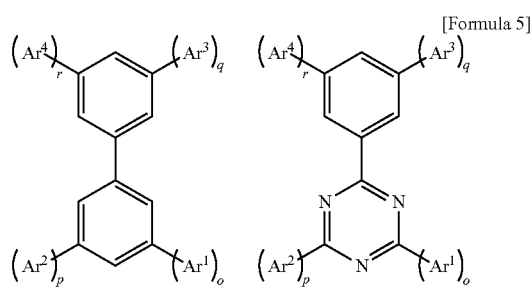

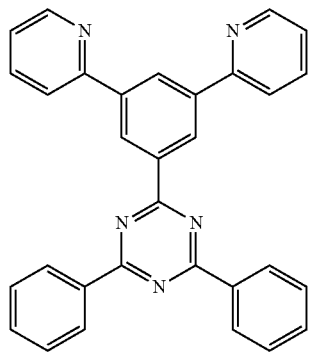

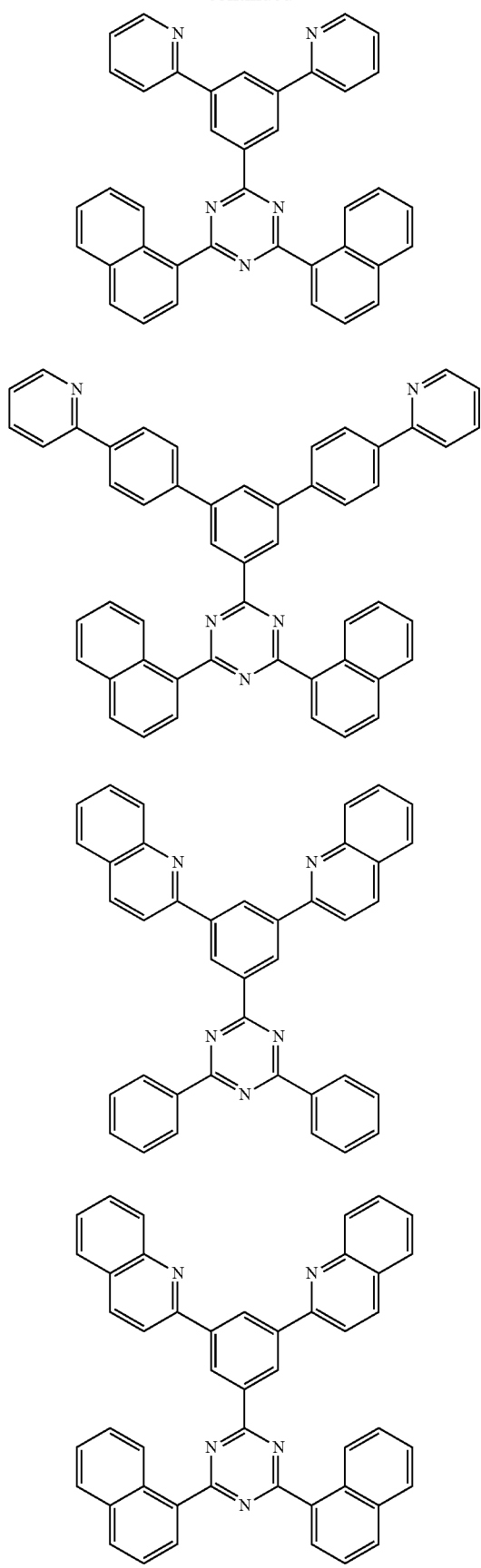
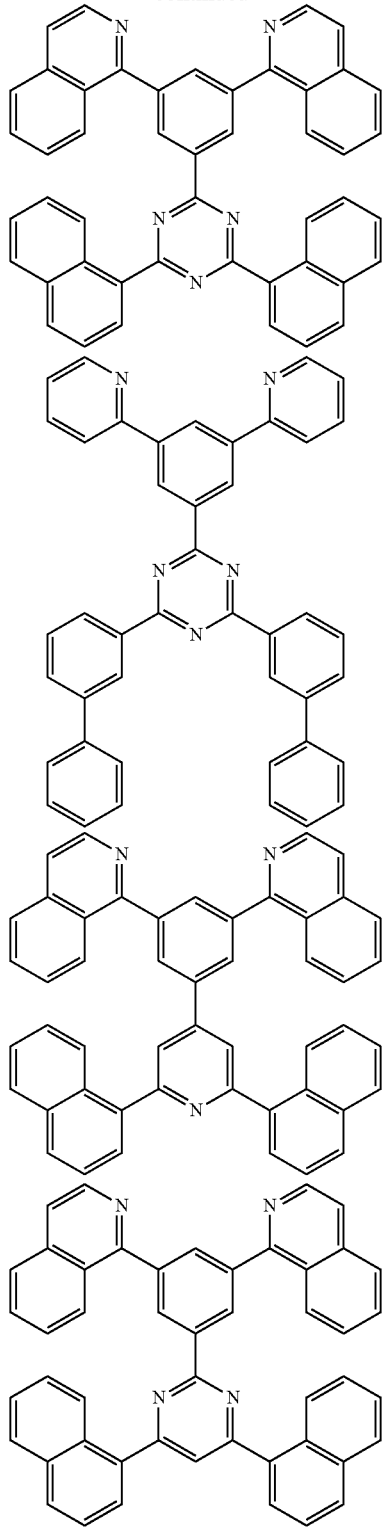
When the electron transport region ETR includes the electron transport layer ETL, the electron transport region ETR may further include, e.g., Alq3, TPBi, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), (2-(4-biphenylyl)-5-(4- tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2), ADN, and a mixture thereof.

The thickness of the electron transport layer ETR may be from about 100 Å to about 1,000 Å, e.g., from about 150 Å to about 500 Å. When the thickness of the electron transport layer ETL satisfies the above described range, satisfactory electron transport properties may be obtained without inducing substantial increase of a driving voltage.

When the electron transport region ETR includes the electron injection layer EIL, the electron transport region ETR may further include, e.g., LiF, lithium quinolate (LiQ), Li$_2$O, BaO, NaCl, CsF, a lanthanide such as Yb, or a metal halide such as RbCl and RbI. The electron injection layer EIL also may be formed using a mixed material of the hole transport material and an insulating organo metal salt. The organo metal salt may be a material having an energy band gap of greater than or equal to about 4 eV. In an implementation, the organo metal salt may include, e.g., a metal acetate, a metal benzoate, a metal acetoacetate, a metal acetylacetonate, or a metal stearate.

The thickness of the electron injection layer EIL may be from about 1 Å to about 100 Å, e.g., from about 3 Å to about 90 Å. When the thickness of the electron injection layer EIL satisfies the above described range, satisfactory electron injection properties may be obtained without inducing the substantial increase of a driving voltage.

The electron transport region ETR may include a hole blocking layer, as described above. The hole blocking layer may include at least one of, e.g., BCP and Bphen. The thickness of the hole blocking layer may be from about 20 Å to about 1,000 Å, e.g., from about 30 Å to about 300 Å. When the thickness of the hole blocking layer satisfies the above described range, satisfactory electron injection properties may be obtained without inducing the substantial increase of a driving voltage.

The second electrode EL2 may be provided on the electron transport region ETR. The second electrode EL2 may be a common electrode or a cathode. The second electrode EL2 may be a transmissive electrode, transflective electrode, or reflective electrode.

When the second electrode EL2 is the transmissive electrode, the second electrode EL2 may include Li, Ca, LiF/Ca, LiF/Al, Al, Mg, Ag, a compound thereof or a mixture thereof (e.g., a mixture of Ag and Mg). The second electrode EL2 may include an auxiliary electrode. The auxiliary electrode may include a layer formed by depositing the above-described material toward an emission layer, a transparent metal oxide on the layer, for example, ITO, IZO, ZnO, ITZO, etc.

When the second electrode EL2 is the transflective electrode or the reflective electrode, the second electrode EL2 may include Ag, Mg, Al, Pt, Pd, Au, Ni, Nd, Ir, Cr, Li, Ca, LiF/Ca, LiF/Al, a compound thereof or a mixture thereof (for example, a mixture of Ag and Mg). The second electrode EL2 may be a reflective layer or a transflective layer formed using the above material and a multilayered structure including a transparent conductive layer formed using ITO, IZO, ZnO, ITZO, etc.

When the organic light emitting device OEL is a front luminescent type, the first electrode EL1 may be the reflective type electrode, and the second electrode EL2 may be the transmissive electrode or the transflective electrode. When the organic light emitting device OEL is a backside luminescent type, the first electrode EL1 may be the transmissive electrode or the transflective electrode, and the second electrode EL2 is the reflective electrode.

In the organic light emitting device OEL according to an embodiment, according to the application of a voltage to the first electrode EL1 and the second electrode EL2, respectively, holes injected from the first electrode EL1 may move via the hole transport region HTR to the emission layer EML, and electrons injected from the second electrode EL2 may move via the electron transport region ETR to the emission layer EML. The electrons and the holes may be recombined in the emission layer EML to generate excitons, and light is emitted during the transition of the excitons from an excited state to a ground state.

Generally, the moving velocity of electrons may be smaller than that of holes in an organic light emitting device, and a band gad between the energy band of a hole transport region and the energy band of an emission layer and a band gap between the energy band of the emission layer and the energy band of an electron transport region may be generated. Thus, the probability of the meeting of the electrons and the holes in the emission layer may be low, and the injection of the holes and electrons into the emission layer is not easy, thereby deteriorating emission efficiency.

The display according to an embodiment may include a hole transport region containing a compound represented by the above Formula 1, an emission layer containing a compound represented by the above Formula 3, and an organic light emitting device containing a compound represented by the above Formula 5. Thus, the band gap between the energy band of the hole transport region and the energy band of the emission layer may be decreased, and the hole injection to the emission layer may become easy. In addition, the band gap between the energy band of the emission layer and the energy band of the electron transport region may be decreased, and the electron injection into the emission layer may become easy. Accordingly, the display according to an embodiment may realize high efficiency and long life.

Hereinafter, the display according to an embodiment will be explained. The explanation will be concentrated on different points from the organic light emitting device OEL according to an embodiment described above, and unexplained parts will follow the explanation on the organic light emitting device according to an embodiment described above.

Figure 3:
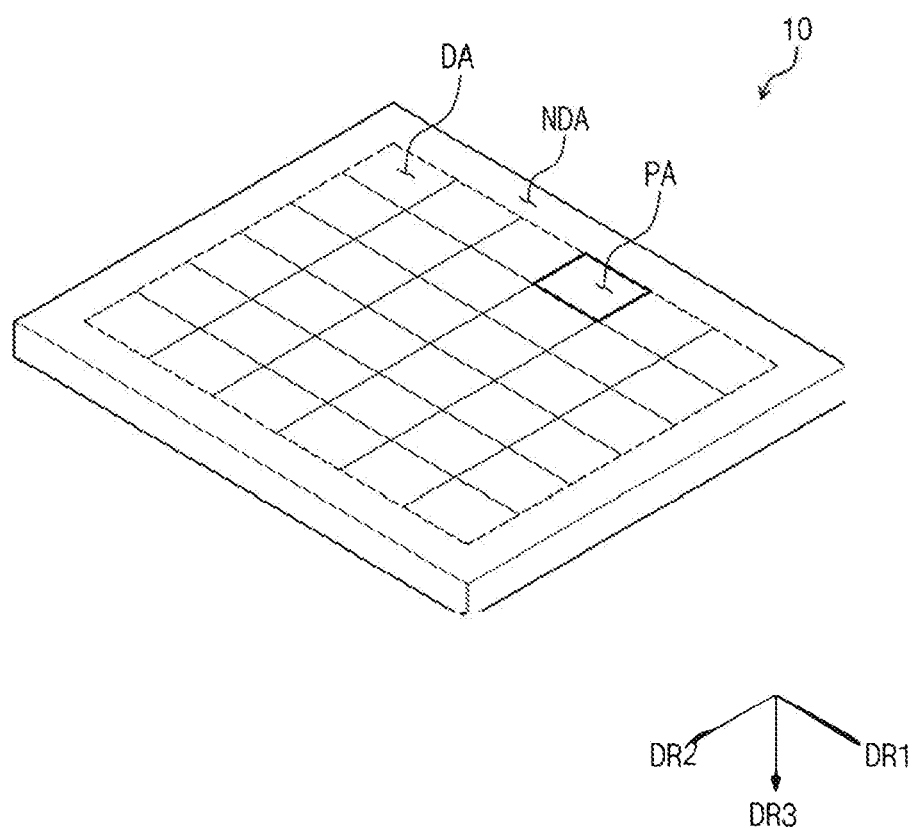
FIG. 3 illustrates a perspective view of a display device according to an embodiment.

FIG. 3 illustrates a perspective view of display device 10 according to an embodiment.

Referring to FIG. 3, a display 10 according to an embodiment may include, e.g., a display area DA and a non-display area NDA.

The display area DA may display an image. When seen from the direction of the thickness of the display 10 (e.g., in DR3), the display area DA may have, e.g., approximately a rectangle shape.

The display area DA may include a plurality of pixel areas PA. The pixel areas PA may be disposed in a matrix shape. The pixel areas PA may be defined by a pixel defining layer (PDL in FIG. 6). Each pixel area PA may include a plurality of pixels (PX in FIG. 4).

A non-display area NDA does not display an image. When seen from the direction of the thickness of the display 100 (e.g., in DR3), the non-display area NDA may be, e.g., surrounded by the display area DA. The non-display area NDA may be adjacent to the display area DA in a first direction (e.g., in DR1) and a second direction (e.g., in DR2) which is perpendicular to the first direction (e.g., DR1).

Figure 4:
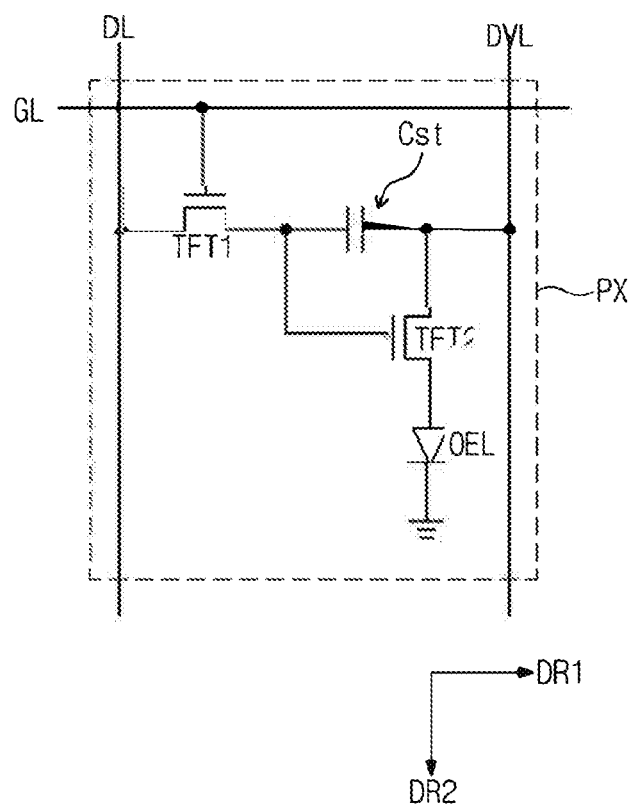
FIG. 4 illustrates a circuit diagram of a pixel included in the display device according to an embodiment.

FIG. 4 illustrates a circuit diagram of a pixel included in the display device 10 according to an embodiment.

Figure 5:
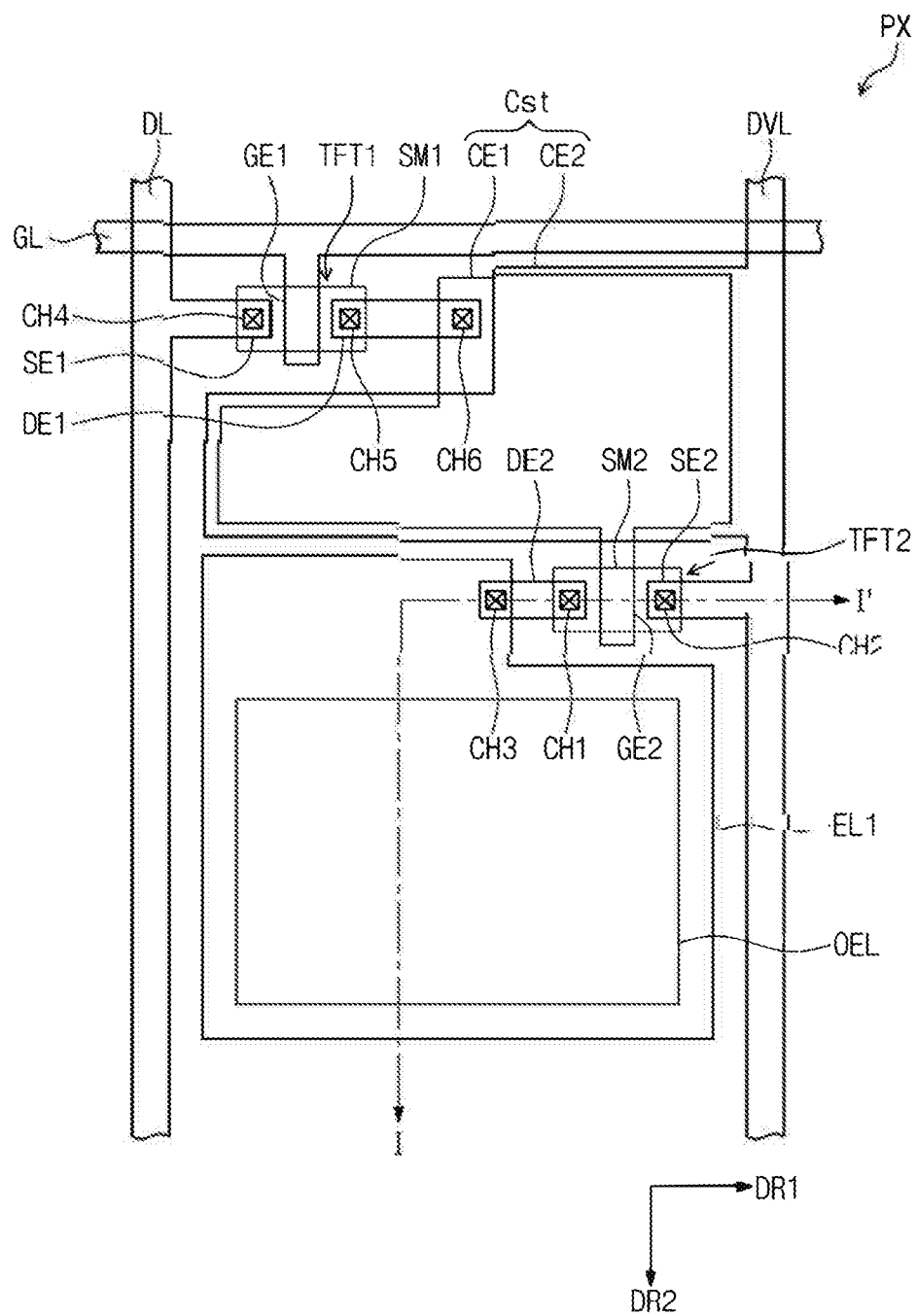
FIG. 5 illustrates a plan view of a pixel included in the display device according to an embodiment.

FIG. 5 illustrates a plan view of a pixel included in the display device 10 according to an embodiment.

Figure 6:
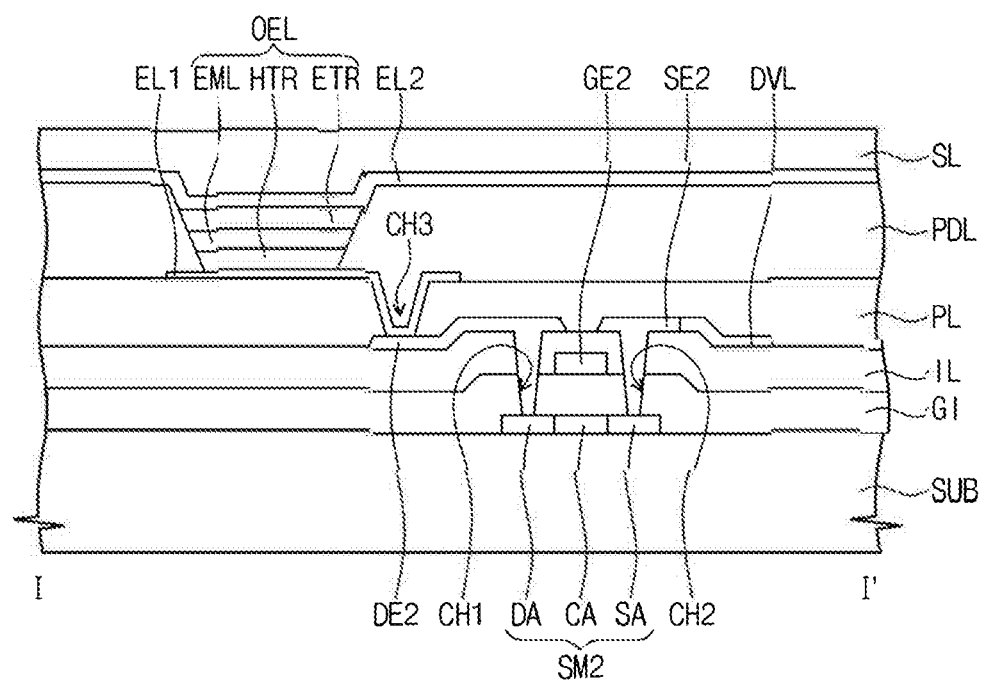
FIG. 6 illustrates a schematic cross-sectional view corresponding to line I-I' in FIG. 5.

FIG. 6 illustrates a schematic cross-sectional view corresponding to line I-I' in FIG. 5.

Referring to FIGS. 4 to 6, each pixel PX may include a wire part including a gate line GL, a data line DL and a driving voltage line DVL, thin film transistors TFT1 and TFT2 connected to the wire part, an organic light emitting device OEL connected to the thin film transistors TFT1 and TFT2, and a capacitor Cst.

Each pixel may emit light having a specific color, e.g., one of red light, green light and blue light. In an implementation, the kind of color light may include, e.g., cyan light, magenta light, yellow light, etc.

The gate line GL may be extended in the first direction DR1. The data line DL may be extended in the second direction DR2 crossing the gate line GL. The driving voltage line DVL may be extended in substantially the same direction as the data line DL, e.g., the second direction DR2. The gate line GL transmits scanning signal to the thin film transistors TFT1 and TFT2, and the data line DL transmits data signal to the thin film transistors TFT1 and TFT2, and the driving voltage line DVL provides a driving voltage to the thin film transistors.

The thin film transistors TFT1 and TFT2 may include a driving thin film transistor TFT2 for controlling the organic light emitting device OEL and a switching thin film transistor TFT1 for switching the driving thin film transistor TFT2. In an implementation, each pixel PX may include two thin film transistors TFT1 and TFT2. Each pixel PX may include one thin film transistor and one capacitor, or each pixel PX may include at least three thin film transistors and at least two capacitors.

The switching thin film transistor TFT1 may include a first gate electrode GE1, a first source electrode SE1 and a first drain electrode DE1. The first gate electrode GE1 may be connected to the gate line GL, and the first source electrode SE1 may be connected to the data line DL. The first drain electrode DE1 may be connected to a first common electrode CE1 via a fifth contact hole CH5. The switching thin film transistor TFT1 transmits data signal applied to the data line DL to the driving thin film transistor TFT2 according to scanning signal applied to the gate line GL.

The driving thin film transistor TFT2 may include a second gate electrode GE2, a second source electrode SE2, and a second drain electrode DE2. The second gate electrode GE2 may be connected to the first common electrode CE1. The second source electrode SE2 may be connected to the driving voltage line DVL. The second drain electrode DE2 may be connected to the first electrode EL1 by a third contact hole CH3.

The organic light emitting device OEL may be between an embossing first electrode B_EL1 and a second electrode EL2. The embossing first electrode B_EL1 may be connected to a second drain electrode DE2 of the driving thin film transistor TFT2. To the second electrode EL2, a common voltage may be applied, and the emission layer EML emits blue light according to the output signal of the driving thin film transistor TFT2, thereby displaying images. The organic light emitting device OEL, the embossing first electrode B_EL1 and the second electrode EL2 will be particularly described below.

The capacitor Cst may be connected between the second gate electrode GE2 and the second source electrode SE2 of the driving thin film transistor TFT2 and may charge and maintain data signal inputted to the second gate electrode GE2 of the driving thin film transistor TFT2. The capacitor Cst may include the first common electrode CE1 connected to the first drain electrode DE1 via a sixth contact hole CH6 and a second common electrode CE2 connected to the driving voltage line DVL.

Referring to FIGS. 5 and 6, the display 10 according to an embodiment may include a substrate SUB on which a thin film transistor and the organic light emitting device OEL are stacked. Suitable substrates may be used as the substrate SUB, and may be formed using an insulating material, e.g., glass, plastics, quartz, etc. As an organic polymer forming the substrate SUB, polyethylene terephthalate (PET), polyethylene naphthalate (PEN), polyimide, polyethersulfone, etc. may be used. The substrate SUB may be selected in consideration of mechanical strength, thermal stability, transparency, surface smoothness, easiness of handling, water-proof properties, etc.

On the substrate SUB, a substrate buffer layer (not shown) may be provided. The substrate buffer layer (not shown) prevents the diffusion of impurities into the switching thin film transistor TFT1 and the driving thin film transistor TFT2. The substrate buffer layer (not shown) may be formed using silicon nitride (SiNx), silicon oxide (SiOx), silicon oxynitride (SiOxNy), etc., and may be omitted according to the material of the substrate SUB and process conditions.

On the substrate SUB, a first semiconductor layer SM1 and a second semiconductor layer SM2 are provided. The first semiconductor layer SM1 and the second semiconductor layer SM2 may be formed using a semiconductor material and function as an active layer of a switching thin film transistor TFT1 and a driving thin film transistor TFT2, respectively. Each of the first semiconductor layer SM1 and the second semiconductor layer SM2 includes a source area SA, a drain area DA and a channel area CA provided between the source area SA and the drain area DA. Each of the first semiconductor layer SM1 and the second semiconductor layer SM2 may be formed by selecting an inorganic semiconductor or an organic semiconductor, respectively. The source area SA and the drain area DA may be doped with n-type impurities or p-type impurities.

On the first semiconductor layer SM1 and the second semiconductor layer SM2, a gate insulating layer GI may be provided. The gate insulating layer GI covers the first semiconductor layer SM1 and the second semiconductor layer SM2. The gate insulating layer GI may be formed using an organic insulating material or an inorganic insulating material.

On the gate insulating layer GI, a first gate electrode GE1 and a second gate electrode GE2 are provided. Each of the first gate electrode GE1 and the second gate electrode GE2 are formed to cover a corresponding area in the channel area CA of the first semiconductor layer SM1 and the second semiconductor layer SM2.

On the first gate electrode GE1 and the second gate electrode GE2, an insulating interlayer IL may be provided. The insulating interlayer IL covers the first gate electrode GE1 and the second gate electrode GE2. The insulating interlayer IL may be formed using an organic insulating material or an inorganic insulating material.

On the insulating interlayer IL, a first source electrode SE1, a first drain electrode DE1, a second source electrode SE2 and a second drain electrode DE2 may be provided. The second drain electrode DE2 makes a contact with the drain area DA of the second semiconductor layer SM2 via a first contact hole CH1 formed in a gate insulating layer GI and the insulating interlayer IL, and the second source electrode SE2 makes a contact with the source area SA of a second semiconductor layer SM2 by a second contact hole CH2 formed in the gate insulating layer GI and the insulating interlayer IL. The first source electrode SE1 makes a contact with the source area (not shown) of the first semiconductor layer SM1 via a fourth contact hole CH4 formed in the gate insulating layer GI and the insulating interlayer IL, and the first drain electrode DE1 makes a contact with the drain area (not shown) of the first semiconductor layer SM1 by a fifth contact hole CH5 formed in the gate insulating layer GI and the insulating interlayer IL.

On the first source electrode SE1, the first drain electrode DE1, the second source electrode SE2 and the second drain electrode DE2, a passivation layer PL may be provided. The passivation layer PL may play the role of the switching thin film transistor TFT1 and the driving thin film transistor TFT2, or the role of a planarization layer for planarizing the top surface thereof.

On the passivation layer PL, a first electrode EL1 may be provided. The first electrode EL1 may be, e.g., an anode. The first electrode EU may be connected to the second drain electrode DE2 of the driving thin film transistor TR2 via the third contact hole CH3 formed in the passivation layer PL.

On the passivation layer PL, a pixel defining layer PDL for partitioning pixel areas (PA in FIG. 3) corresponding to each of the pixels PX may be provided. The pixel defining layer PDL exposes the top surface of the first electrode EL1 and may be extruded from the substrate SUB along the circumference of each of the pixels PX. The pixel defining layer PDL may include, e.g., a metal fluoride ion compound. For example, the pixel defining layer PDL may be formed using LiF, BaF$_2$, or CsF. When the metal fluoride ion compound has a certain thickness, insulating properties may be obtained. The thickness of the pixel defining layer PDL may be, e.g., from about 10 nm to about 100 nm.

To each pixel area (PA in FIG. 3) surrounded by the pixel defining layer PDL, an organic light emitting device OEL is provided. The organic light emitting device OEL includes a hole transport region HTR, an emission layer EML, and an electron transport region ETR.

The hole transport region HTR may include a hole injection layer HIL and a hole transport layer HTL. The hole injection layer HIL may be provided on a first electrode EL1. The hole transport layer HTL may be provided on the hole injection layer HIL.

The electron transport region ETR may include an electron transport layer ETL and an electron injection layer EIL. The electron transport layer ETL may be provided on the emission layer EML. The electron injection layer EIL may be provided on the electron transport layer ETL.

The hole transport region HTR may include a compound represented by the following Formula 1. The display according to an embodiment may include an organic light emitting device including a hole transport region including the compound represented by the following Formula 1, thereby decreasing a band gap between the energy band of the hole transport region and the energy band of the emission layer and facilitating hole injection into the emission layer. Thus, the display according to an embodiment may realize high efficiency and long life.

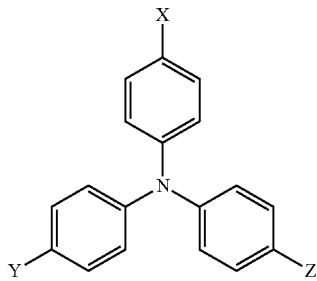

[Formula 1]

In the above Formula 1, X, Y, and Z may each independently be selected from or include, e.g., hydrogen, deuterium, a substituted or unsubstituted aromatic group having 5 to 30 carbon atoms (e.g., a substituted or unsubstituted condensed aromatic group having 5 to 30 carbon atoms), and a substituted or unsubstituted heteroaromatic group having 5 to 30 carbon atoms (e.g., a substituted or unsubstituted condensed heteroaromatic group having 5 to 30 carbon atoms). In an implementation, X, Y, and Z may each independently be selected from or include, e.g., a substituted or unsubstituted heteroaromatic group having 5 to 30 carbon atoms and including N, S or O, and a substituted or unsubstituted condensed heteroaromatic group having 5 to 30 carbon atoms and including N, S or O.

In an implementation, X, Y, and Z may each independently be selected from or include, e.g., hydrogen, deuterium, a substituted or unsubstituted aryl group having 5 to 30 carbon atoms, a substituted or unsubstituted heteroaryl group having 5 to 30 carbon atoms, a substituted or unsubstituted aryloxy group having 5 to 30 carbon atoms, a substituted or unsubstituted arylamino group having 5 to 30 carbon atoms, a substituted or unsubstituted diarylamino group having 5 to 30 carbon atoms, and a substituted or unsubstituted arylakyl group having 5 to 30 carbon atoms.

In an implementation, X, Y, and Z may each independently be selected from, e.g., a phenyl group, a naphthyl group, a biphenyl group, a terphenyl group, an anthracene group, a fluorenyl group, and a carbazolyl group.

The hole transport region HTR may include at least one of the following compounds.

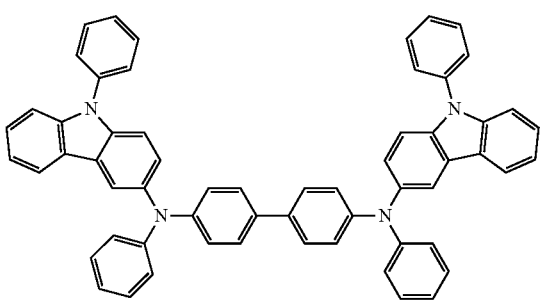

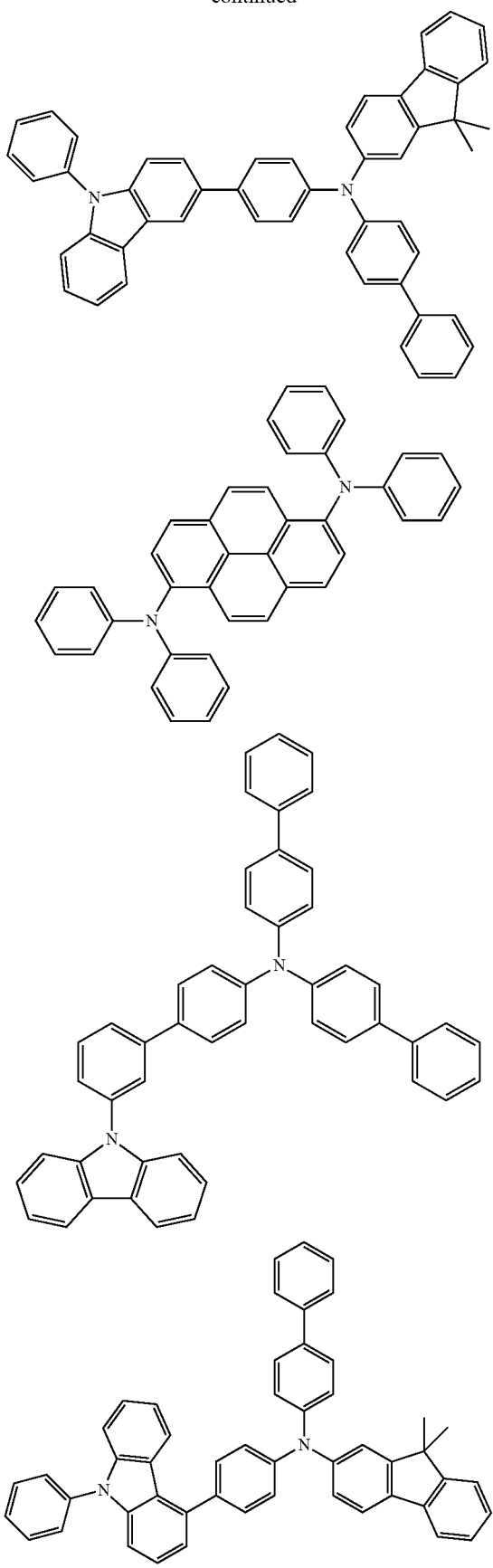
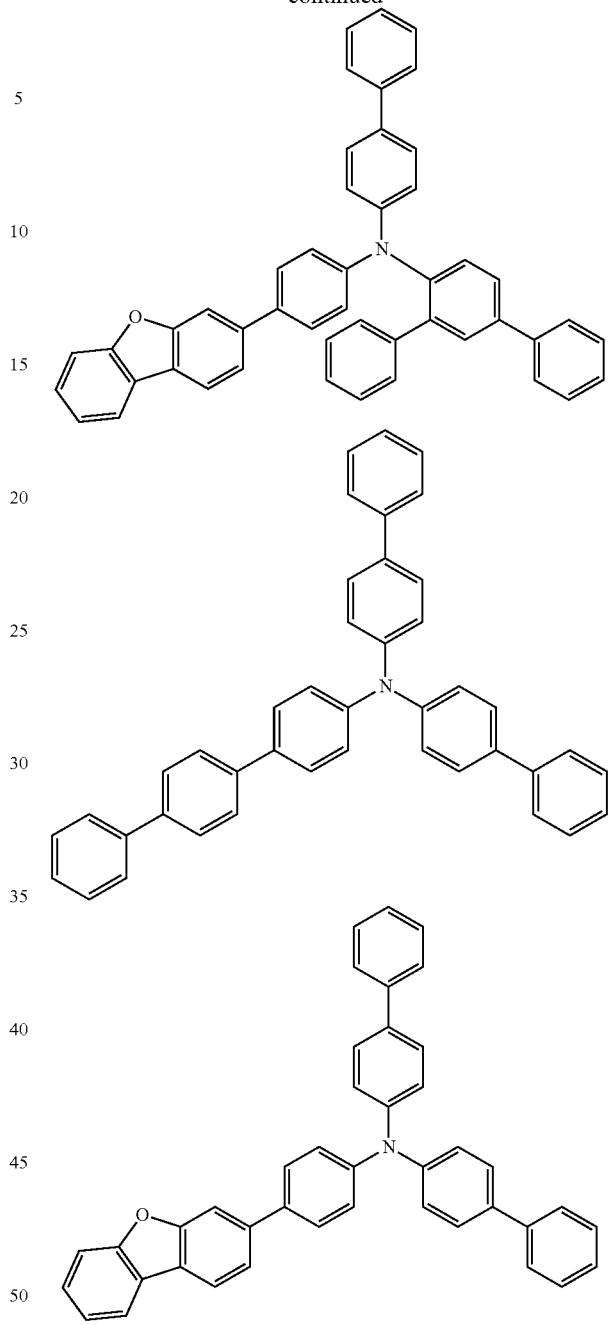

The emission layer EML may be provided on the hole transport region HTR. The emission layer EML may be formed using suitable materials, e.g., materials emitting red, green, and blue light and may include a phosphorescent material or a fluorescent material. In addition, the emission layer EML may include a host or a dopant.

The host may include a compound represented by the following Formula 3. The display according to an embodiment may include an organic light emitting device including an emission layer including the compound represented by the following Formula 3, and may decrease a band gap between the energy band of the hole transport region and the energy band of the emission layer. Thus, the hole injection into the emission layer may be easily performed. In addition, a band gap between the energy band of the emission layer and the energy band of the electron transport region may be decreased, and the electron injection into the emission layer may be easily performed. Therefore, the display according to an embodiment may exhibit high efficiency and long life.

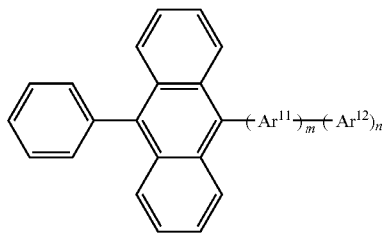

[Formula 3]

In the above Formula 3, $Ar^{11}$ and $Ar^{12}$ may each independently be selected from or include, e.g., hydrogen, deuterium, a substituted or unsubstituted aromatic group having 5 to 30 carbon atoms, (e.g., a substituted or unsubstituted condensed aromatic group having 5 to 30 carbon atoms), and a substituted or unsubstituted heteroaromatic group having 5 to 30 carbon atoms (e.g., a substituted or unsubstituted condensed heteroaromatic group having 5 to 30 carbon atoms). In an implementation, $Ar^{11}$ and $Ar^{12}$ may each independently be selected from or include, e.g., a substituted or unsubstituted heteroaromatic group having 5 to 30 carbon atoms and including N, S or O, and a substituted or unsubstituted condensed heteroaromatic group having 5 to 30 carbon atoms and including N, S or O. m and n may each independently be an integer of 0 to 3.

In an implementation, $Ar^{11}$ may include, e.g., a substituted or unsubstituted arylene group having 7 to 30 carbon atoms or a substituted or unsubstituted heteroarylene group having 7 to 30 carbon atoms. In the case that m is 0, $Ar^{11}$ may be a single bond. In an implementation, $Ar^{12}$ may include, e.g., a substituted or unsubstituted aryl group having 5 to 30 carbon atoms or a substituted or unsubstituted heteroaryl group having 5 to 30 carbon atoms. In the case that m or n is an integer greater than or equal to 2, $Ar^{11}$ may be the same or different, $Ar^{12}$ may be the same or different, and $Ar^{11}$ and $Ar^{12}$ may be the same or different from each other.

In an implementation, $Ar^{11}$ may be, e.g., a substituted or unsubstituted phenyl group or a substituted or unsubstituted naphthyl group.

In an implementation, the host may include at least one of the following compounds.

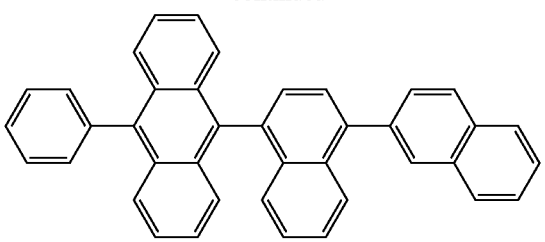

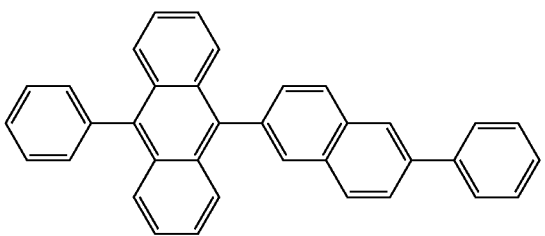

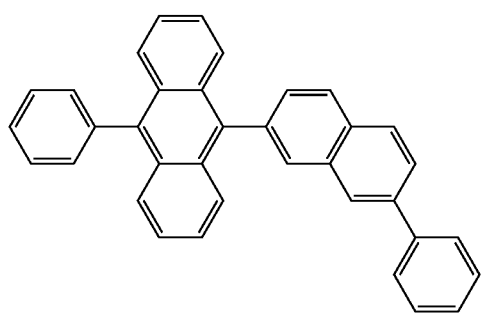

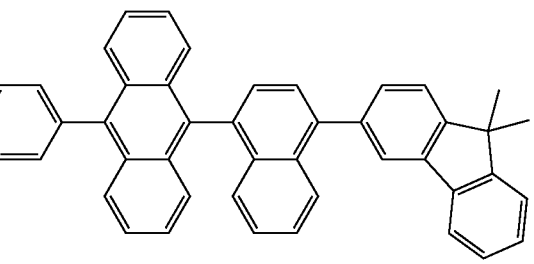

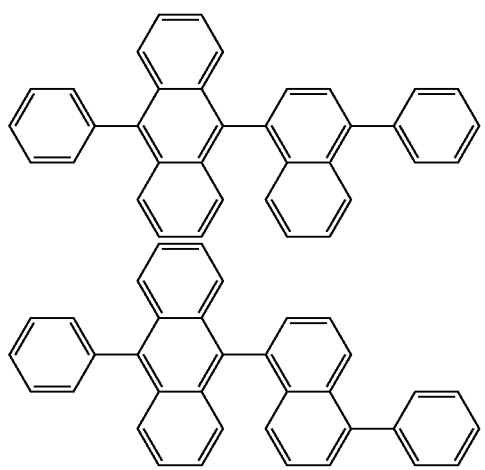

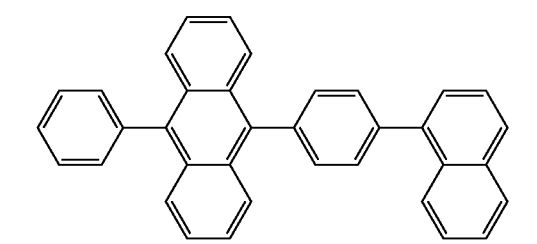

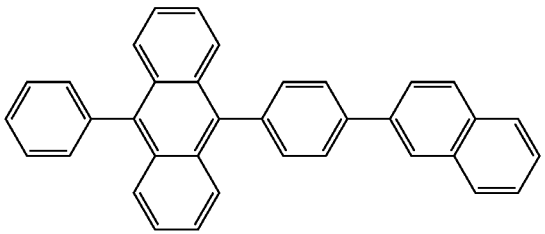

-continued

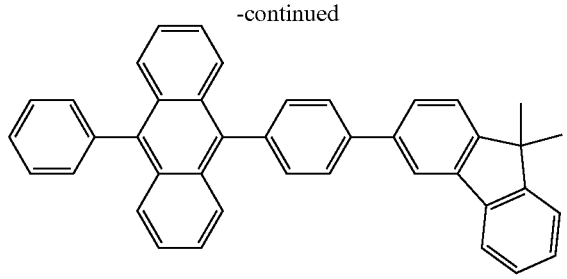

The electron transport region ETR may be provided on the emission layer EML. The electron transport region ETR may include at least one compound of the following Formula 5. The display device according to an embodiment may include an organic light emitting device including a compound of the following Formula 5. Thus, a band gap between the energy band of the emission layer and the energy band of the electron transport layer may be decreased, and the injection of electrons into the emission layer may become easy. Thus, the display according to an embodiment may exhibit high efficiency and long life.

[Formula 5]

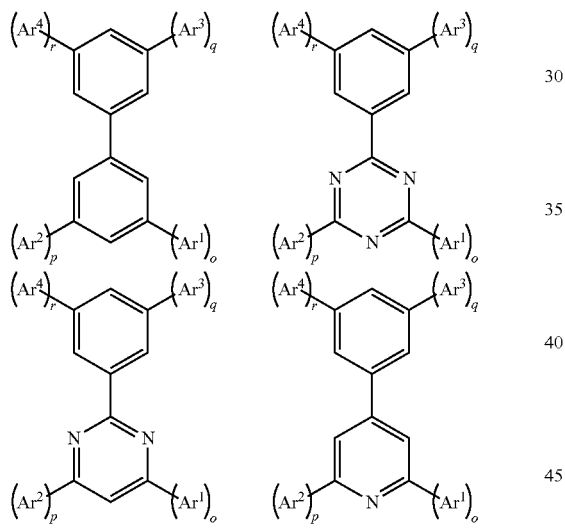

In the above compounds, $Ar^1$, $Ar^2$, $Ar^3$, and $Ar^4$ may each independently be selected from or include, e.g., hydrogen, deuterium, a substituted or unsubstituted aromatic group having 5 to 30 carbon atoms (e.g., a substituted or unsubstituted condensed aromatic group having 5 to 30 carbon atoms), and a substituted or unsubstituted heteroaromatic group having 5 to 30 carbon atoms (e.g., a substituted or unsubstituted condensed heteroaromatic group having 5 to 30 carbon atoms). In an implementation, $Ar^1$, $Ar^2$, $Ar^3$, and $Ar^4$ may each independently be selected from or include, e.g., a substituted or unsubstituted heteroaromatic group having 5 to 30 carbon atoms and including N, S or O and a substituted or unsubstituted condensed heteroaromatic group having 5 to 30 carbon atoms and including N, S or O. o, p, q, and r may each independently be an integer of 1 to 3.

In an implementation, $Ar^1$, $Ar^2$, $Ar^3$, and $Ar^4$ may each independently be selected from or include, e.g., a substituted or unsubstituted aryl group having 5 to 30 carbon atoms or a substituted or unsubstituted heteroaryl group having 5 to 30 carbon atoms. In the case that o, p, q, and/or r are independently greater than or equal to 2, $Ar^1$ may be the same or different, $Ar^2$ may be the same or different, $Ar^3$ may be the same or different, $Ar^4$ may be the same or different, and Ar1, Ar2, $Ar^3$ and $Ar^4$ may be the same from each other, or at least one thereof may be different.

The electron transport region ETR may include at least one of the following compounds.

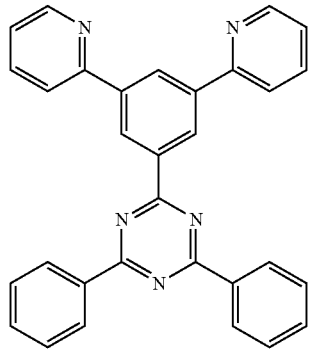

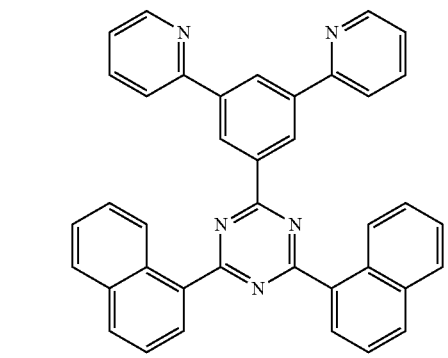

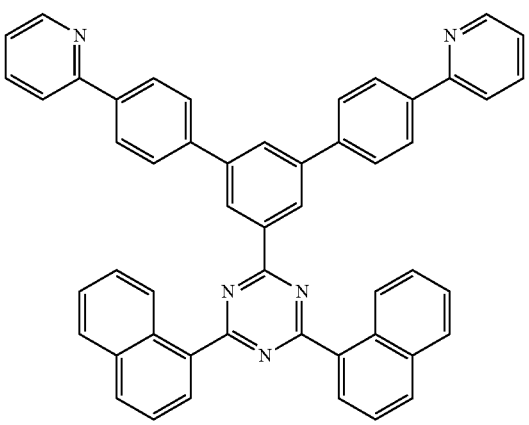

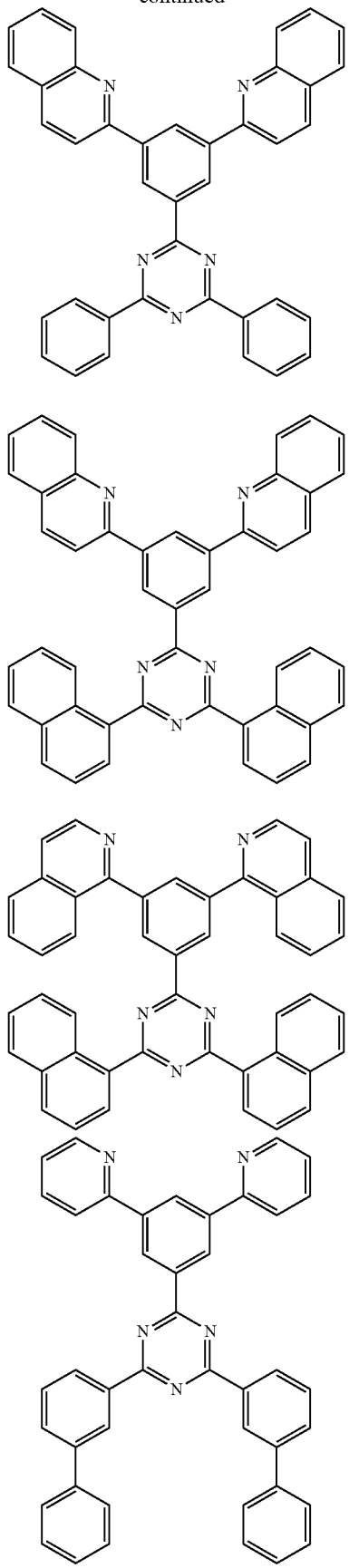

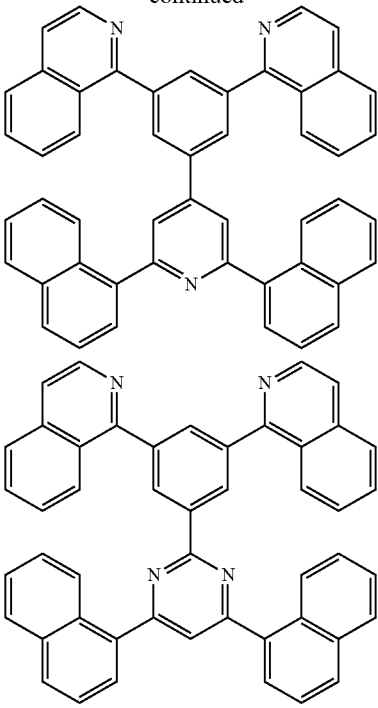

On the second electrode EL2, a sealing layer SL covering the second electrode EL2 may be provided. The sealing layer may include at least one of an organic layer and an inorganic layer. The sealing layer SL passivates the organic light emitting device OEL.

Generally, the moving velocity of electrons may be smaller than that of holes in an organic light emitting device, and a band gad between the energy band of a hole transport region and the energy band of an emission layer and a band gap between the energy band of the emission layer and the energy band of an electron transport region may be generated. Thus, the probability of the meeting of the electrons and the holes in the emission layer may be low, and the injection of the holes and electrons into the emission layer is not easy, thereby deteriorating emission efficiency.

The display according to an embodiment may include a hole transport region containing a compound represented by the above Formula 1, an emission layer containing a compound represented by the above Formula 3, and an organic light emitting device containing a compound of the above Formula 5 (e.g., in the electron transport region). Thus, the band gap between the energy band of the hole transport region and the energy band of the emission layer may be decreased, and the hole injection into the emission layer may become easy. In addition, the band gap between the energy band of the emission layer and the energy band of the electron transport region may be decreased, and the electron injection into the emission layer may become easy. Accordingly, the display according to an embodiment may realize high efficiency and long life.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

On a glass substrate, an anode was formed using ITO to a thickness of about 120 nm. After performing ultrasonic washing and pre-treatment (UV-O$_3$ treatment, heat treatment), the following compound HT1 was deposited on the anode to a thickness of about 50 nm to from a hole injection layer. On the hole injection layer, the following compound HT2 was deposited to a thickness of about 45 nm to form a hole transport layer. On the hole transport layer, the following compound H1 as a host material and 5% of the following compound D1 as a dopant were deposited at the same time to a thickness of about 50 nm to form an emission layer. On the emission layer, the following compound E1 as an electron transporting material was deposited to a thickness of about 25 nm to form an electron transport region. On the electron transport region, lithium fluoride was deposited to a thickness of about 0.5 nm, and on the lithium fluoride, aluminum was deposited to a thickness of about 150 nm to form a cathode.

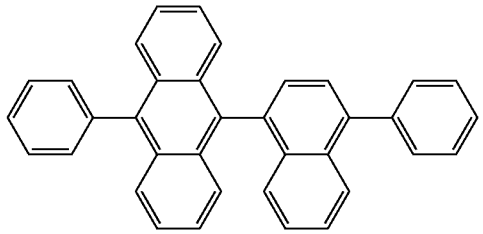

H1

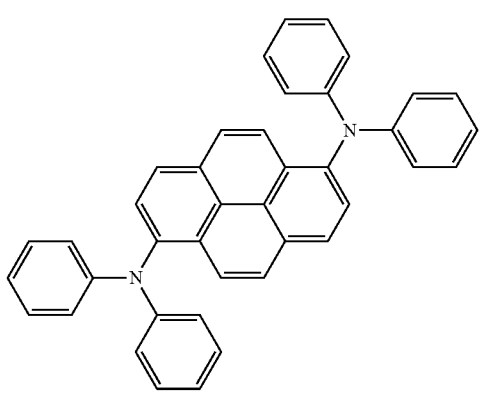

D1

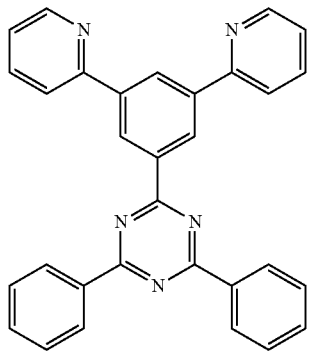

E1

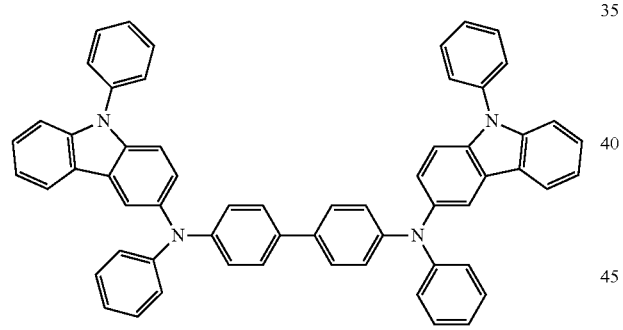

HT1

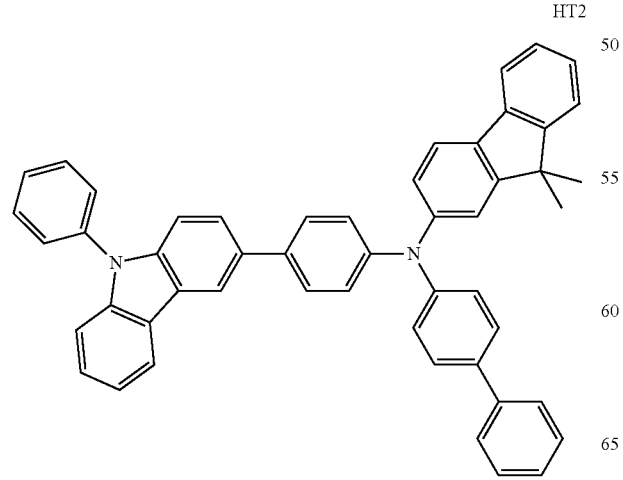

HT2

Examples 2 to 6

Organic light emitting devices were manufactured by performing the same procedure described in Example 1 except for forming the hole transport layer using compounds described in the following Table 1.

TABLE 1

| | Compounds of hole transport layer |
|---|---|
| Example 2 | HT3 |
| Example 3 | HT4 |
| Example 4 | HT5 |
| Example 5 | HT6 |
| Example 6 | HT7 |

TABLE 1-continued

Compounds of hole transport layer

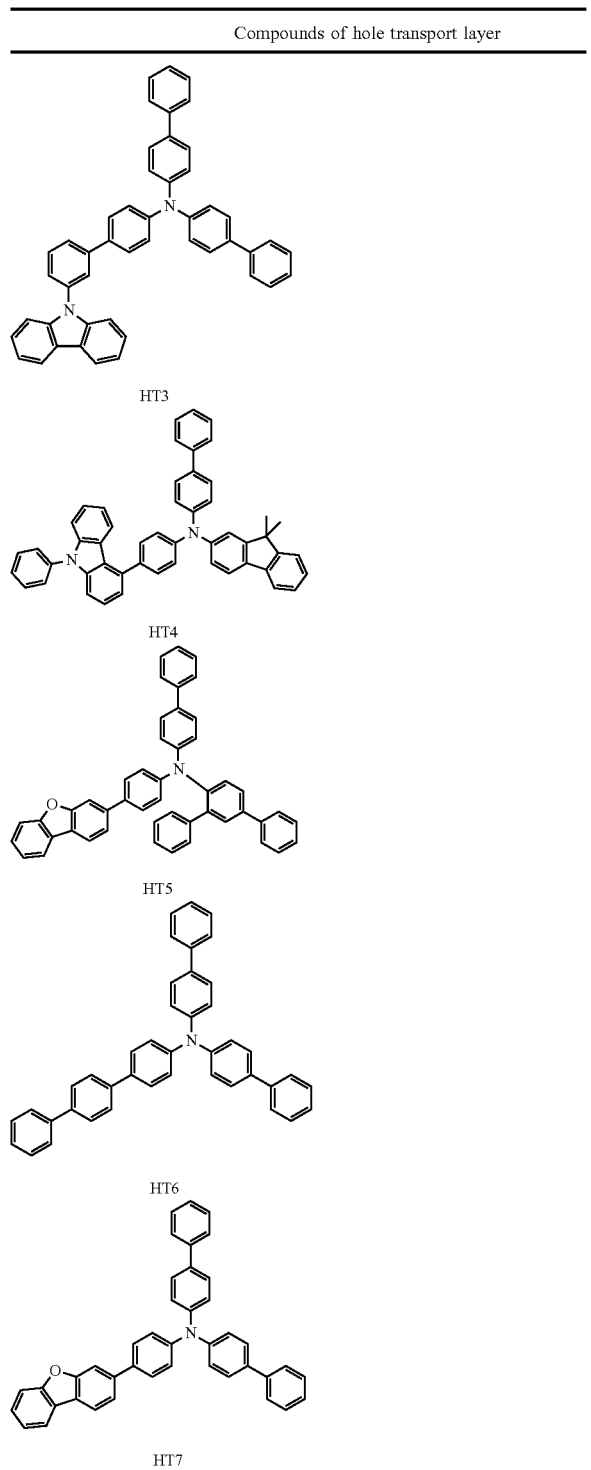

HT3

HT4

HT5

HT6

HT7

Experimental Results

Current efficiency and life of the organic light emitting devices of Examples 1 to 6 were measured, and the results are illustrated in the following Table 2. The current efficiency of the organic light emitting device was measured in the conditions of the current density of 10 mA/cm$^2$, and the life was obtained by measuring a time period when luminance was decreased to 80% from an initial luminance value in the conditions of the current density of 50 mA/cm$^2$.

TABLE 2

|  | Efficiency (cd/A) | Life (hr) |
| --- | --- | --- |
| Example 1 | 5.2 | 100 |
| Example 2 | 5.1 | 150 |
| Example 3 | 5.0 | 130 |
| Example 4 | 5.2 | 135 |
| Example 5 | 5.1 | 147 |
| Example 6 | 5.2 | 131 |

Referring to the above Table 2, it may be seen that each organic light emitting device of Examples 1 to 6 has high efficiency and long life.

The embodiments may provide an organic light emitting device having high efficiency and long life.

The embodiments may provide a display device including the organic light emitting device having high efficiency and long life.

In the organic light emitting device according to an embodiment, efficiency may be increased, and life may be extended.

In the display device according to an embodiment, efficiency may be increased, and life may be extended.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
a first electrode;
a hole transport region on the first electrode;
an emission layer on the hole transport region;
an electron transport region on the emission layer; and
a second electrode on the electron transport region,
wherein the hole transport region includes a compound represented by the following Formula 1b:

[Formula 1b]

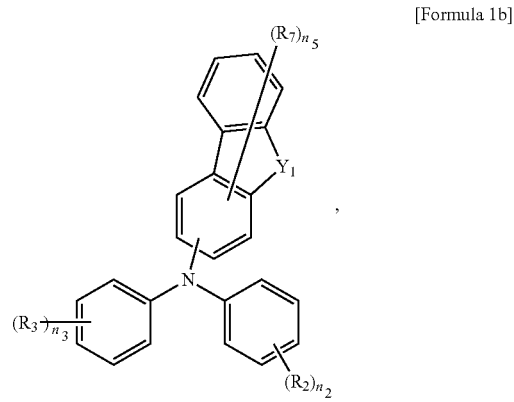

wherein, in Formula 1b,
$R_2$ and $R_3$ are each independently selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, or combine with an adjacent group to form a ring, $n_2$ and $n_3$ are each independently an integer of 0 to 5, $Y_1$ is selected from O, $NR_9$, and $CR_{10}R_{11}$, $R_7$, $R_9$, $R_{10}$, and $R_{11}$ are each independently selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, $n_5$ is an integer of 0 to 7, the compound represented by Formula 1b is not

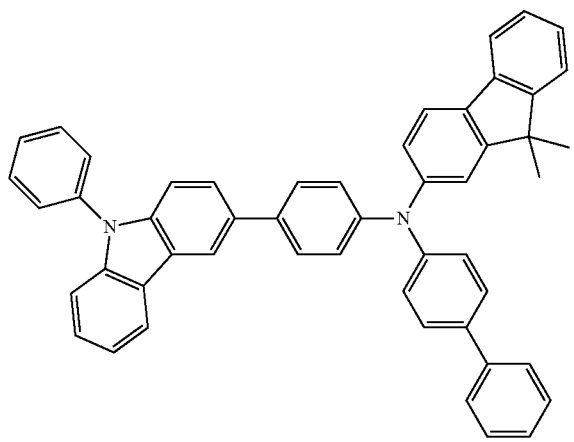

and wherein the electron transport region includes a compound represented by the following Formula 5b to 5e:

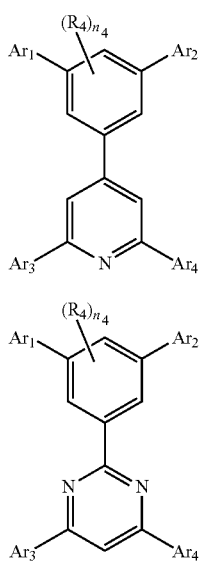
[Formula 5b]

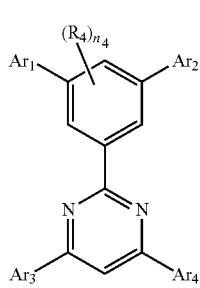
[Formula 5c]

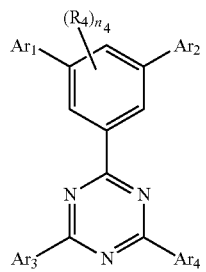
[Formula 5d]

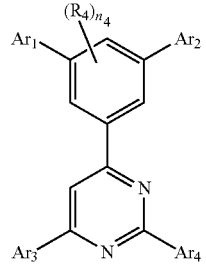
[Formula 5e]

wherein, in Formula 5b to 5e, $Ar_1$, $Ar_2$, $Ar_3$, and $Ar_4$ are each independently selected from hydrogen, deuterium, a substituted or unsubstituted aromatic group having 5 to 30 carbon atoms, and a substituted or unsubstituted heteroaromatic group having 5 to 30 carbon atoms, $R_4$ is selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, $n_4$ is an integer of 0 to 3, and when $Ar_3$ and $Ar_4$ are each an unsubstituted phenyl group, $Ar_1$ and $Ar_2$ are each selected from hydrogen, deuterium, an unsubstituted phenyl group, and a substituted or unsubstituted heteroaromatic group having 5 to 30 carbon atoms, and $R_4$ is selected from hydrogen, deuterium, a substituted or unsubstituted alkyl group having 1 to 10 carbon atoms, and a substituted or unsubstituted aromatic group having 5 to 30 carbon atoms.

2. The organic light emitting device as claimed in claim 1, wherein the emission layer includes a compound represented by the following Formula 3:

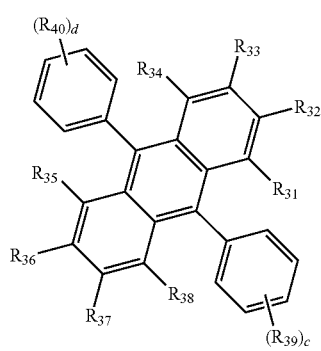
[Formula 3]

wherein, in Formula 3, $R_{31}$ to $R_{40}$ are each independently selected from hydrogen, deuterium, halogen atom, a substituted or unsubstituted silyl group, a substituted or unsubstituted alkyl group having 1 to 10 carbon atoms, a substituted or unsubstituted aromatic group having 6 to 30 carbon atoms, and a substituted or unsubstituted heteroaromatic group having 2 to 30 carbon atoms, or combine with an adjacent group to form a ring, and c and d are each independently an integer of 0 to 5.

3. The organic light emitting device as claimed in claim 1, wherein, in Formula 1b, $R_2$ and $R_3$ are a substituted amino group, a substituted alkyl group having 1 to 10 carbon atoms, a substituted aromatic group having 5 to 30 carbon atoms, or a substituted heteroaromatic group having 5 to 30 carbon atoms, and the substituent is selected from a substituted or unsubstituted amino group, a substituted or unsubstituted alkyl group having 1 to 10 carbon atoms, a substituted or unsubstituted aromatic group having 5 to 30 carbon atoms, or a substituted or unsubstituted heteroaromatic group having 5 to 30 carbon atoms.

4. The organic light emitting device as claimed in claim 1, wherein, in Formula 1b, $R_2$ and $R_3$ are each independently selected from hydrogen, deuterium, a substituted or unsubstituted aryl group having 5 to 30 carbon atoms, a substituted or unsubstituted heteroaryl group having 5 to 30 carbon atoms, a substituted or unsubstituted aryloxy group having 5 to 30 carbon atoms, a substituted or unsubstituted arylamino group having 5 to 30 carbon atoms, a substituted or unsubstituted diarylamino group having 5 to 30 carbon atoms, and a substituted or unsubstituted arylakyl group having 5 to 30 carbon atoms.

5. The organic light emitting device as claimed in claim 1, wherein, in Formula 1b, $R_2$ and $R_3$ are each independently selected from a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, and a substituted or unsubstituted carbazolyl group.

6. The organic light emitting device as claimed in claim 1, wherein, in Formula 5b to 5e, $Ar_1$ and $Ar_2$ are each independently a substituted or unsubstituted heteroaryl group having 5 to 30 carbon atoms.

7. The organic light emitting device as claimed in claim 1, wherein, in Formula 5b to 5e, $Ar_3$ and $Ar_4$ are each independently a substituted or unsubstituted aryl group having 5 to 30 carbon atoms.

8. The organic light emitting device as claimed in claim 1, wherein the electron transport region includes the compound represented by Formula 5b to 5d, the compound represented by Formula 5b to 5d including at least one of the following compounds:

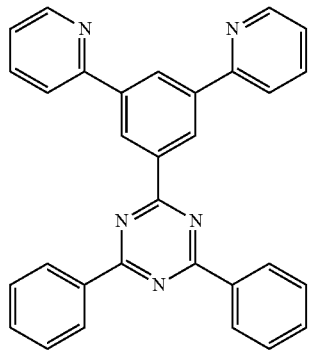

-continued

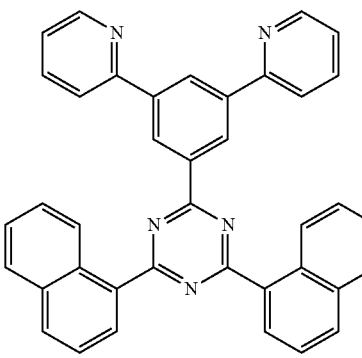

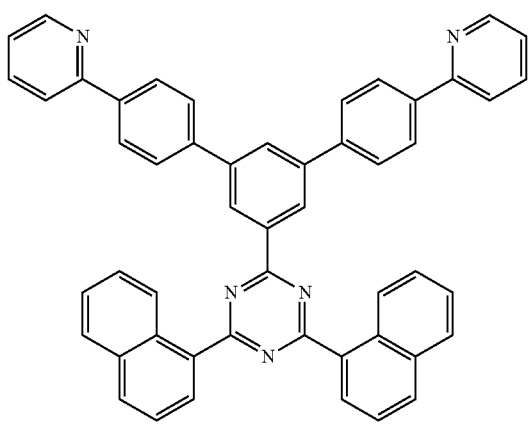

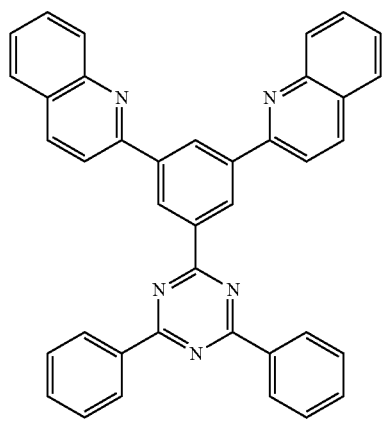

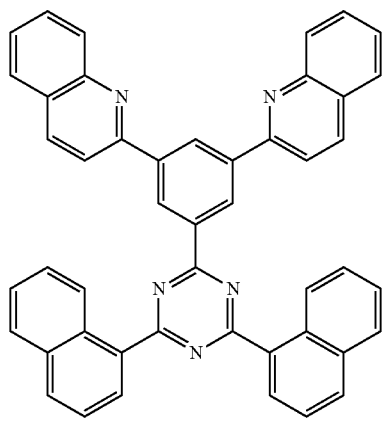

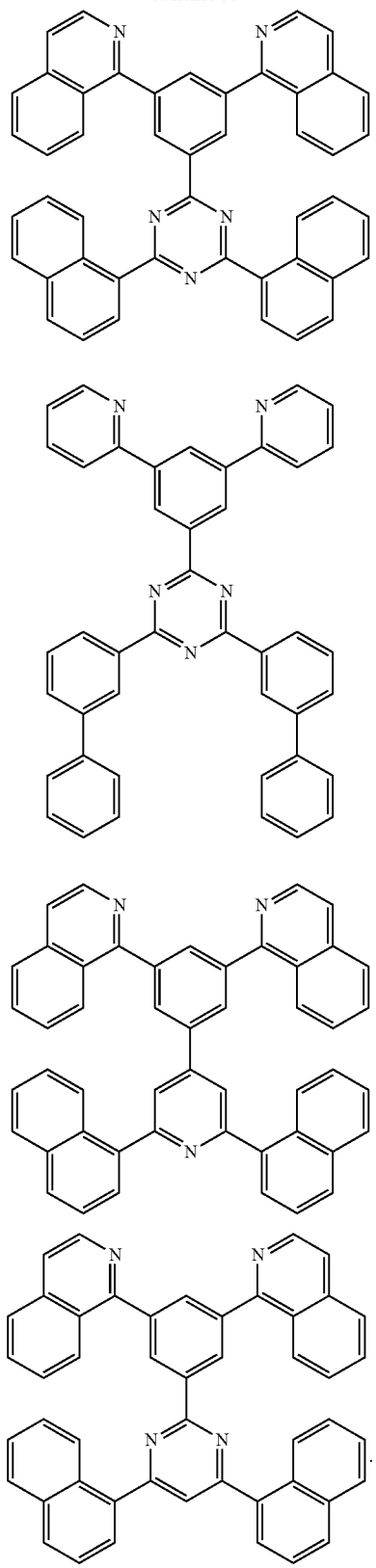
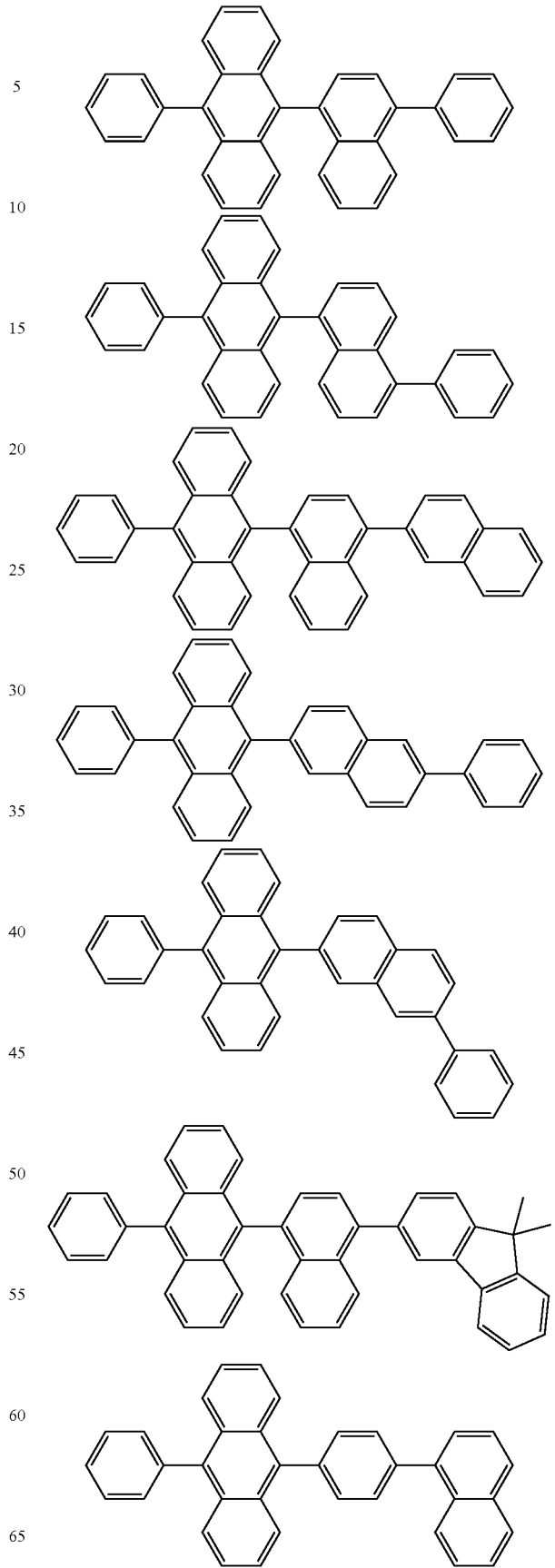
9. The organic light emitting device as claimed in claim 2, wherein the compound represented by Formula 3 of the emission layer includes one of the following compounds:

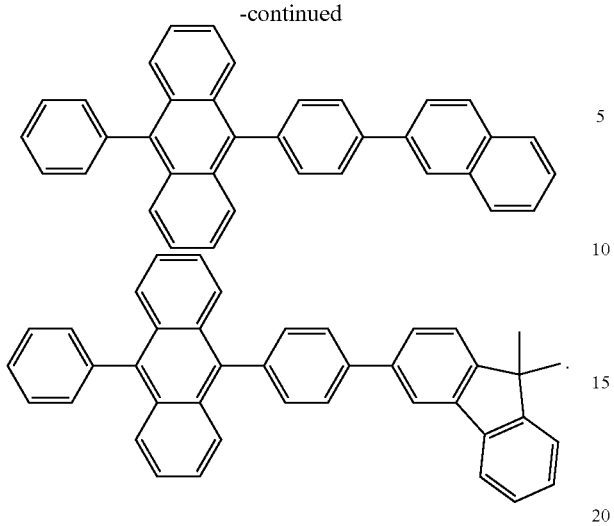

10. The organic light emitting device as claimed in claim 1, wherein:
the electron transport region includes an electron transport layer and an electron injection layer, and
the electron transport region further includes LiF, NaCl, CsF, RbCl, RbI, Yb, Li2O, BaO, or lithium quinolate (Liq).

11. An organic light emitting device, comprising:
a first electrode;
a hole transport region on the first electrode;
an emission layer on the hole transport region;
an electron transport region on the emission layer; and
a second electrode on the electron transport region,
wherein the hole transport region includes a compound represented by the following Formula 1b:

[Formula 1b]

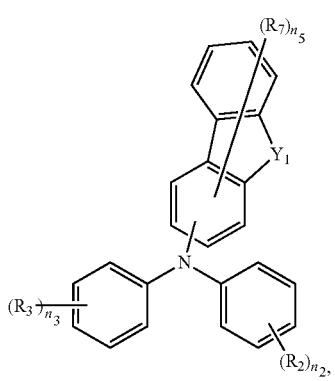

wherein, in Formula 1b,
$R_2$ and $R_3$ are each independently selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, or combine with an adjacent group to form a ring,
$n_2$ and $n_3$ are each independently an integer of 0 to 5,
$Y_1$ is selected from O, $NR_9$, and $CR_{10}R_{11}$,
$R_7$, $R_9$, $R_{10}$, and $R_{11}$ are each independently selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, $n_5$ is an integer of 0 to 7,
wherein the electron transport region includes a compound represented by the following Formula 5b to 5e:

[Formula 5b]

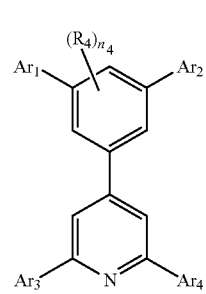

[Formula 5c]

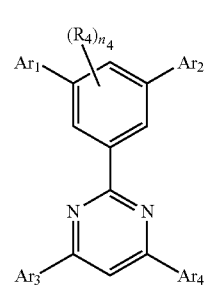

[Formula 5d]

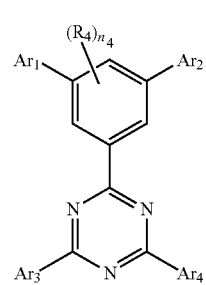

[Formula 5e]

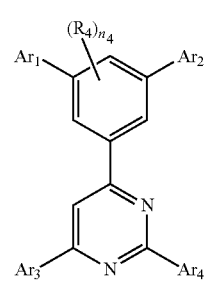

wherein, in Formula 5b to 5e,
$Ar_1$, $Ar_2$, $Ar_3$, and $Ar_4$ are each independently selected from hydrogen, deuterium, a substituted or unsubstituted aromatic group having 5 to 30 carbon atoms, and a substituted or unsubstituted heteroaromatic group having 5 to 30 carbon atoms,
$R_4$ is selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, $n_4$ is an integer of 0 to 3, and wherein the emission layer includes a compound represented by the following Formula 3:

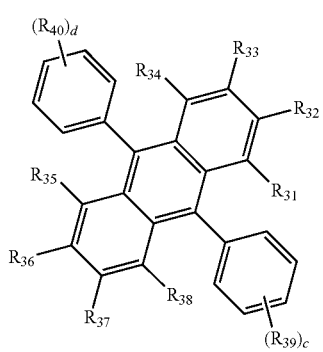

[Formula 3]

wherein, in Formula 3, $R_{31}$ to $R_{40}$ are each independently selected from hydrogen, deuterium, halogen atom, a substituted or unsubstituted silyl group, a substituted or unsubstituted alkyl group having 1 to 10 carbon atoms, a substituted or unsubstituted aromatic group having 6 to 30 carbon atoms, and a substituted or unsubstituted heteroaromatic group having 2 to 30 carbon atoms, or combine with an adjacent group to form a ring, and c and d are each independently an integer of 0 to 5, wherein when $Ar_3$ and $Ar_4$ are each an unsubstituted phenyl group, $Ar_1$ and $Ar_2$ are each selected from hydrogen, deuterium, a substituted or unsubstituted aromatic group having 5 to 30 carbon atoms, a pyridinyl group, and a quinolinyl group.

12. The organic light emitting device as claimed in claim 11, wherein, in Formula 1b, $R_2$ and $R_3$ are a substituted amino group, a substituted alkyl group having 1 to 10 carbon atoms, a substituted aromatic group having 5 to 30 carbon atoms, or a substituted heteroaromatic group having 5 to 30 carbon atoms, and the substituent is selected from a substituted or unsubstituted amino group, a substituted or unsubstituted alkyl group having 1 to 10 carbon atoms, a substituted or unsubstituted aromatic group having 5 to 30 carbon atoms, or a substituted or unsubstituted heteroaromatic group having 5 to 30 carbon atoms.

13. The organic light emitting device as claimed in claim 11, wherein, in Formula 1b, $R_2$ and $R_3$ are each independently selected from hydrogen, deuterium, a substituted or unsubstituted aryl group having 5 to 30 carbon atoms, a substituted or unsubstituted heteroaryl group having 5 to 30 carbon atoms, a substituted or unsubstituted aryloxy group having 5 to 30 carbon atoms, a substituted or unsubstituted arylamino group having 5 to 30 carbon atoms, a substituted or unsubstituted diarylamino group having 5 to 30 carbon atoms, and a substituted or unsubstituted arylakyl group having 5 to 30 carbon atoms.

14. The organic light emitting device as claimed in claim 11, wherein, in Formula 1b, $R_2$ and $R_3$ are each independently selected from a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, and a substituted or unsubstituted carbazolyl group.

15. An organic light emitting device, comprising:

a first electrode;

a hole transport region on the first electrode;

an emission layer on the hole transport region;

an electron transport region on the emission layer; and a second electrode on the electron transport region, wherein the hole transport region includes a compound represented by the following Formula 1b:

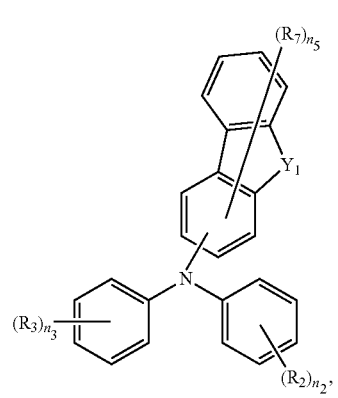

[Formula 1b]

wherein, in Formula 1b, $R_2$ and $R_3$ are each independently selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, or combine with an adjacent group to form a ring, $n_2$ and $n_3$ are each independently an integer of 0 to 5, $Y_1$ is selected from O, $NR_9$, and $CR_{10}R_{11}$, $R_7$, $R_9$, $R_{10}$, and $R_{11}$ are each independently selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms, $n_5$ is an integer of 0 to 7, wherein the electron transport region includes a compound represented by the following Formula 5b to 5e:

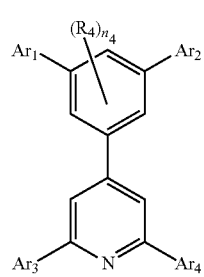

[Formula 5b]

-continued

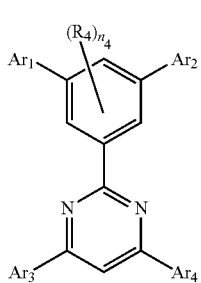
[Formula 5c]

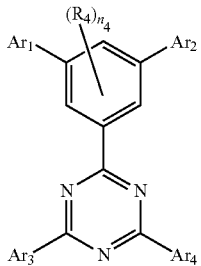
[Formula 5d]

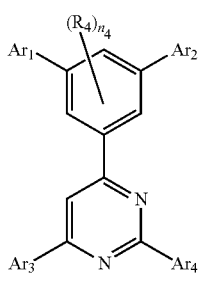
[Formula 5e]

wherein, in Formula 5b to 5e,
$Ar_3$, and $Ar_4$ are each independently selected from hydrogen, deuterium, a substituted or unsubstituted aromatic group having 5 to 30 carbon atoms, and a substituted or unsubstituted heteroaromatic group having 5 to 30 carbon atoms,
$R_4$ is selected from hydrogen, deuterium, a substituted or unsubstituted amino group, a substituted or unsubstituted alkyl group having 1 to 10 carbon atoms, a substituted or unsubstituted aromatic group having 5 to 30 carbon atoms, and a substituted or unsubstituted heteroaromatic group having 5 to 30 carbon atoms,
$n_4$ is an integer of 0 to 3, and
wherein the emission layer includes a compound represented by the following Formula 3:

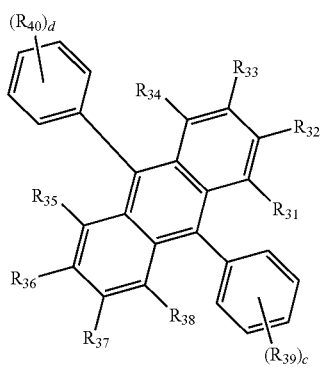
[Formula 3]

wherein, in Formula 3,
$R_{31}$ to $R_{40}$ are each independently selected from hydrogen, deuterium, halogen atom, a substituted or unsub-
stituted silyl group, a substituted or unsubstituted alkyl group having 1 to 10 carbon atoms, a substituted or unsubstituted aromatic group having 6 to 30 carbon atoms, and a substituted or unsubstituted heteroaromatic group having 2 to 30 carbon atoms, or combine with an adjacent group to form a ring, and
c and d are each independently an integer of 0 to 5, and
wherein, in Formula 5b to 5e, $Ar_1$ and $Ar_2$ are each independently a substituted or unsubstituted heteroaryl group having 5 to 30 carbon atoms.

16. The organic light emitting device as claimed in claim 11, wherein, in Formula 5b to 5e, $Ar_3$ and $Ar_4$ are each independently a substituted or unsubstituted aryl group having 5 to 30 carbon atoms.

17. The organic light emitting device as claimed in claim 11, wherein the electron transport region includes the compound represented by Formula 5b to 5d, the compound represented by Formula 5b to 5d including at least one of the following compounds:

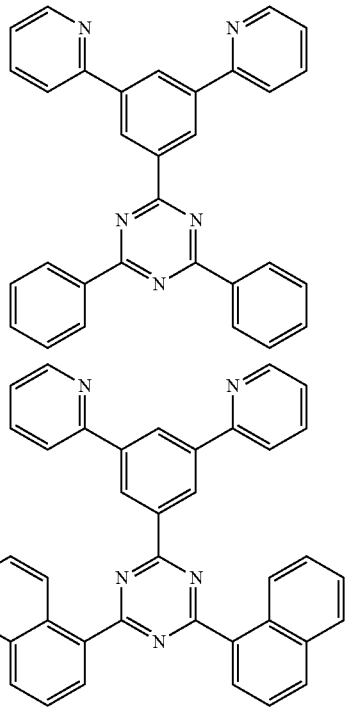

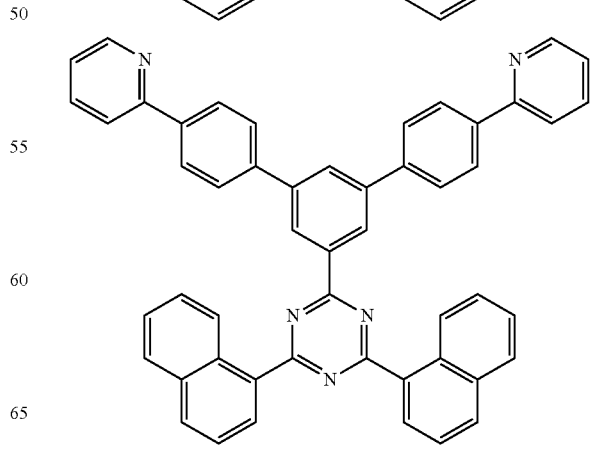

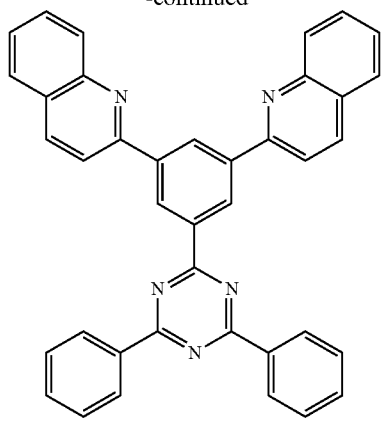
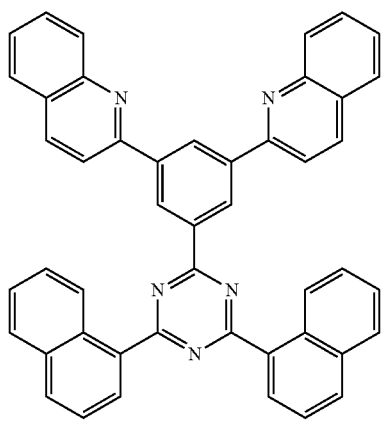
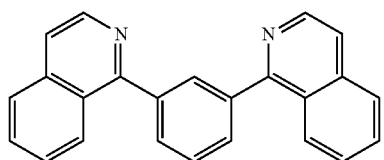
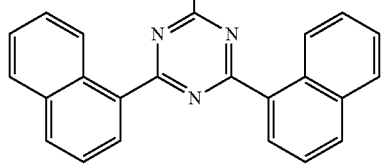
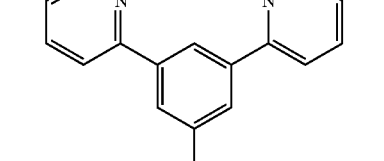
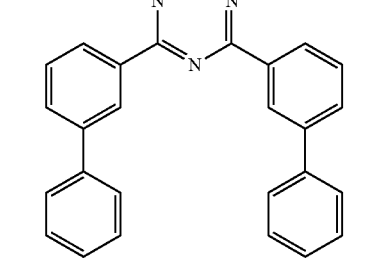
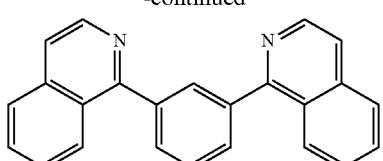
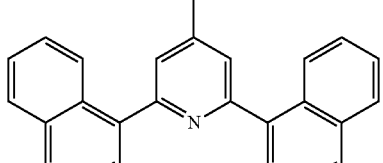
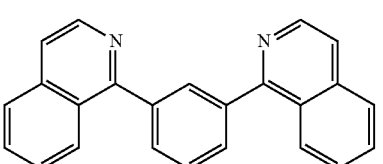
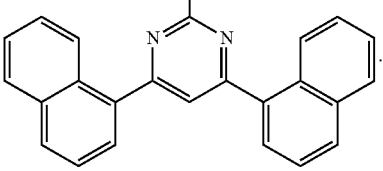
18. The organic light emitting device as claimed in claim 11, wherein the compound represented by Formula 3 of the emission layer includes one of the following compounds:
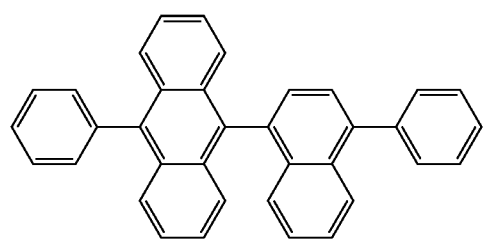
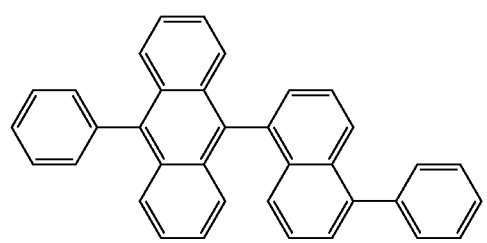
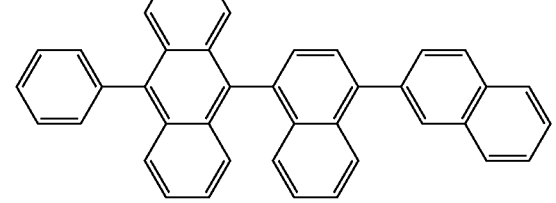

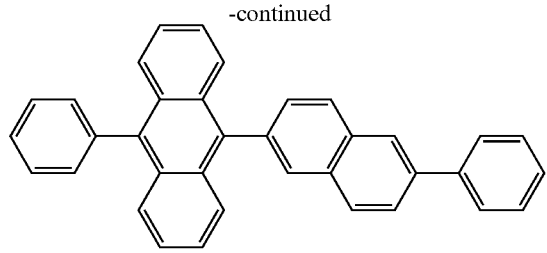
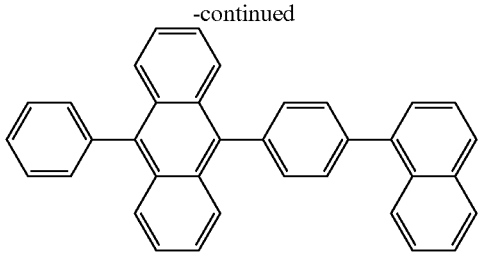
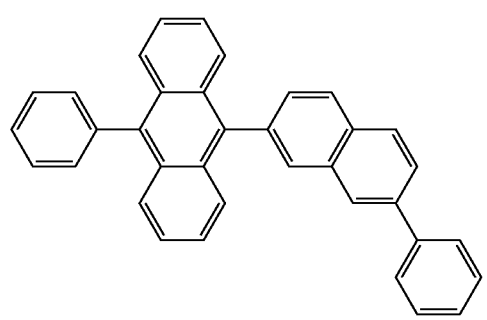
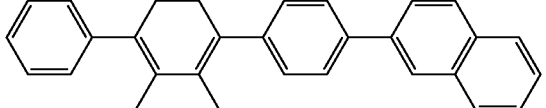
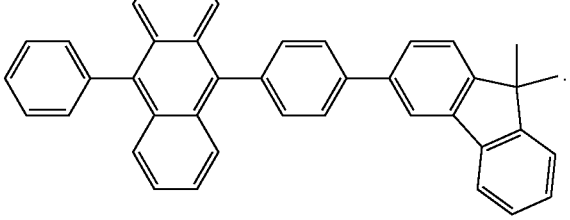
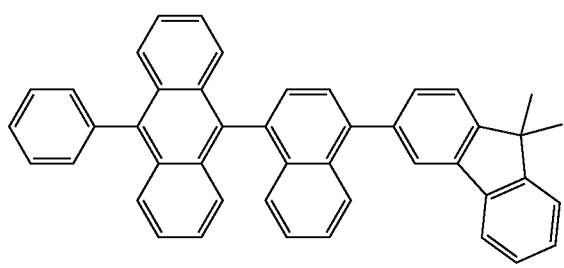
19. The organic light emitting device as claimed in claim 11, wherein:
   the electron transport region includes an electron transport layer and an electron injection layer, and
   the electron transport region further includes LiF, NaCl, CsF, RbCl, RbI, Yb, Li2O, BaO, or lithium quinolate (Liq).
* * * * *